United States Patent
Adachi et al.

(10) Patent No.: US 7,050,525 B2
(45) Date of Patent: May 23, 2006

(54) FREQUENCY SYNTHESIZER APPARATUS EQUIPPED WITH FRACTION PART CONTROL CIRCUIT, COMMUNICATION APPARATUS, FREQUENCY MODULATOR APPARATUS, AND FREQUENCY MODULATING METHOD

(75) Inventors: Hisashi Adachi, Osaka (JP); Toshifumi Nakatani, Osaka (JP); Hiroaki Kosugi, Osaka (JP); Masakatsu Maeda, Kyoto (JP); Shunsuke Hirano, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 263 days.

(21) Appl. No.: 10/728,863

(22) Filed: Dec. 8, 2003

(65) Prior Publication Data
US 2004/0081266 A1    Apr. 29, 2004

Related U.S. Application Data

(62) Division of application No. 09/733,949, filed on Dec. 12, 2000, now Pat. No. 6,717,998.

(30) Foreign Application Priority Data
Dec. 13, 1999   (JP)   ............................. P11-352964

(51) Int. Cl.
*H03D 3/24*    (2006.01)
*H03L 7/00*    (2006.01)
*H03C 3/06*    (2006.01)

(52) U.S. Cl. ................. 375/376; 331/25; 327/156

(58) Field of Classification Search ............... 375/327, 375/376; 331/1 A, 1 R, 16, 17, 18, 25; 327/156; 332/127, 128; 455/260; 713/400, 500, 503; 341/143
See application file for complete search history.

(56) References Cited

U.S. PATENT DOCUMENTS

| | | | |
|---|---|---|---|
| 4,609,881 A | 9/1986 | Wells | 331/1 A |
| 5,055,802 A | 10/1991 | Hietala et al. | 331/16 |
| 5,111,162 A | 5/1992 | Hietala et al. | 332/127 |
| 5,986,512 A | 11/1999 | Eriksson | 331/16 |
| 6,236,703 B1 | 5/2001 | Riley | 331/1 A |

FOREIGN PATENT DOCUMENTS

| | | |
|---|---|---|
| DE | 196 40 071 | 4/1998 |
| EP | 0 429 217 | 7/1990 |
| EP | 0 788 237 | 7/1996 |
| JP | 2756728 | 3/1998 |

*Primary Examiner*—Betsy L. Deppe
(74) *Attorney, Agent, or Firm*—Wenderoth, Lind & Ponack, L.L.P.

(57) ABSTRACT

A fraction part control circuit of a frequency synthesizer apparatus including a PLL circuit is of a plural-n-th-order delta-sigma modulator circuit for controlling a fraction part of a number of frequency division to a variable frequency divider of the PLL circuit. An adder adds data of the fraction part to an output data from a multiplier and outputs the resultant data to a quantizer through a second-order integrator. The quantizer quantizes input data with a quantization step and outputs the quantized data to the multiplier through a feedback circuit. The quantized data is used as data of the controlled fraction part. The multiplier multiplies data from the feedback circuit by the quantization step and outputs the resultant data to the adder. The fraction part control circuit periodically changes the data of the fraction part, thereby setting a frequency of an output signal from a VCO according to an average value of the period.

1 Claim, 13 Drawing Sheets

SECOND-ORDER
INTEGRATOR 7

MODIFIED PREFERRED EMBODIMENT
SECOND-ORDER
INTEGRATOR 7a

SECOND PREFERRED EMBODIMENT
FRACTION PART CONTROL CIRCUIT 5a

SECOND-ORDER
INTEGRATOR 7b

MODIFIED PREFERRED EMBODIMENT
SECOND-ORDER
INTEGRATOR 7c

MODIFIED PREFERRED EMBODIMENT
SECOND-ORDER
INTEGRATOR 7d

THIRD PREFERRED EMBODIMENT
FRACTION PART CONTROL CIRCUIT 5b

FOURTH PREFERRED EMBODIMENT
FRACTION PART CONTROL CIRCUIT 5c

FIFTH PREFERRED EMBODIMENT
FRACTION PART CONTROL CIRCUIT 5d

THIRD-ORDER INTEGRATOR 40

MODIFIED PREFERRED EMBODIMENT
THIRD-ORDER INTEGRATOR 40a

MODIFIED PREFERRED EMBODIMENT
THIRD-ORDER
INTEGRATOR 40b

SIXTH PREFERRED EMBODIMENT
FRACTION PART CONTROL CIRCUIT 5e

EIGHTH PREFERRED EMBODIMENT
RADIO COMMUNICATION APPARATUS

NINTH PREFERRED EMBODIMENT
FREQUENCY MODULATOR APPARATUS

FREQUENCY SYNTHESIZER APPARATUS

FRACTION PART CONTROL CIRCUIT 80

US 7,050,525 B2

FREQUENCY SYNTHESIZER APPARATUS EQUIPPED WITH FRACTION PART CONTROL CIRCUIT, COMMUNICATION APPARATUS, FREQUENCY MODULATOR APPARATUS, AND FREQUENCY MODULATING METHOD

This is a Divisional Application of U.S. application Ser. No. 09/733,949, filed Dec. 12, 2000 now U.S. Pat. No. 6,717,998.

BACKGROUND OF THE INVENTION

1. Field of the Invention

The present invention relates to a frequency synthesizer apparatus equipped with a fraction part control circuit, a communication apparatus, a frequency modulator apparatus, and a frequency modulating method each utilizing the frequency synthesizer apparatus. In particular, the present invention relates to a frequency synthesizer apparatus comprising a phase-locked loop circuit (hereinafter referred to as a PLL circuit) and a fraction part control circuit, which utilizes the PLL circuit to control a fraction part of a number of frequency division inputted to a variable frequency divider provided in the PLL circuit, a communication apparatus, a frequency modulator apparatus, and a frequency modulating method each utilizing the frequency synthesizer apparatus.

2. Description of the Related Art

Generally speaking, an output frequency of a frequency synthesizer apparatus using a PLL circuit is expressed by a quotient that is calculated by dividing a reference signal frequency by a number of frequency division set in a variable frequency divider. Since a general variable frequency divider can set only the number of frequency division as integer data, the output frequency is equal to an integral multiple of the frequency of the reference signal, and thus, the output frequency cannot be set to a unit that is smaller than the frequency of the reference signal. Therefore, the frequency of the reference signal must be lowered when it is necessary to set the output frequency at shorter frequency intervals. However, the lower reference signal frequency causes a larger number of frequency division of the variable frequency divider, and noise occurring in an output signal also increases as the number of frequency division increases. Since a response bandwidth of the PLL circuit cannot be wider than that of the frequency of the reference signal, a response speed of a loop of the PLL circuit decreases, and this leads to the period of switching over between frequencies to increase.

A method for obtaining a number of frequency division having decimal precision by using a general variable frequency divider has been known as a method for solving the above-mentioned problems. This method is provided for realizing a number of frequency division having a decimal precision as average data by periodically changing the number of frequency division. This method utilizes a delta-sigma modulator circuit (or a Δ-Σ modulator circuit: sometimes called a sigma-delta modulator circuit (or a Σ-Δ modulator circuit)).

FIG. 19 is a block diagram showing a circuit configuration of a frequency synthesizer apparatus of the prior art. The frequency synthesizer apparatus is provided for realizing a number of frequency division having decimal precision.

Referring to FIG. 19, the frequency synthesizer apparatus comprises a voltage control oscillator 1 (hereinafter referred to as a VCO), a variable frequency divider 2 (or frequency demultiplier), a phase comparator 3, and a low-pass filter 4 including a loop filter, which are connected in a loop configuration. The frequency synthesizer apparatus further comprises a fraction part control circuit 80 and an adder 6. The variable frequency divider 2 divides the frequency of an output signal from the VCO 1 in accordance with input data of a number of frequency division, and then outputs the frequency-divided signal to the phase comparator 3. The phase comparator 3 performs a phase comparison between an input reference signal and the output signal from the variable frequency divider 2, and then outputs a signal indicating the result of phase comparison to the VCO 1 through the low-pass filter 4. Thus, a PLL circuit is feedback-controlled so as to stabilize the output frequency of the VCO 1.

Referring to FIG. 19 again, the fraction part control circuit 80 comprises an adder 81 and a delay circuit 82. The adder 81 adds data of a fraction part F inputted from an external apparatus to output data from the delay circuit 82, and then outputs the resultant addition data to the delay circuit 82. The delay circuit 82 is a latch circuit which operates by using the output signal from the variable frequency divider 2 as a clock. The adder 6 adds an output signal indicating an overflow of the adder 81, i.e., a carry signal (indicating data of the controlled fraction part F), to data of an integral part M inputted from the external apparatus, and then inputs and sets resultant addition data as data of a number of frequency division in the variable frequency divider 2.

In the frequency synthesizer apparatus of FIG. 19 configured as described above, when a fraction part is equal to F, data of the output signal from the adder 81 increases by the fraction part F every clock period. When the adder 81 overflows as a result of a data L, the adder 81 overflows F times for a period of L clocks, and generates the carry signal.

FIG. 20 is a block diagram of a detailed configuration of the fraction part control circuit 80 shown in FIG. 19, showing the configuration using a z-transformation. In FIG. 20, $z^{-1}$ represents the delay of one clock. Output data Y from the fraction part control circuit 80 is expressed by the following Equation (1).

$$Y=F/L+(1-z^{-1})Q \quad (1)$$

An operation of the fraction part control circuit 80 is equivalent to that of a first-order delta-sigma modulator circuit. Generation of the carry signal is equivalent to quantization using a quantization step L.

Referring to FIG. 20, the fraction part control circuit 80 comprises an adder 91, a delay circuit 92, a quantizer 93, a multiplier 94 and a subtracter 95. The adder 91 corresponds to the adder 81 shown in FIG. 19. The delay circuit 92 corresponds to the delay circuit 82 shown in FIG. 19. The subtracter 95 subtracts output data from the multiplier 94 from data of the fraction part F inputted from the external apparatus, and then outputs resultant subtraction data to the adder 91. The adder 91 adds an output signal from the delay circuit 92 to an output signal from the subtracter 95, and then outputs the result of addition to the delay circuit 92 and the quantizer 93. The quantizer 93 quantizes an output signal from the adder 91 using the quantization step L, and then outputs the quantized signal. The multiplier 94 multiplies the output signal from the quantizer 93 by the quantization step L, and then outputs a resultant multiplication signal to the subtracter 95.

FIG. 21 shows timing charts of an operation of the frequency synthesizer apparatus shown in FIG. 19, where FIG. 21(a) is a timing chart showing a change over time in a number of frequency division inputted to the variable frequency divider 2, and FIG. 21(b) is a timing chart showing a change over time in a control voltage to the VCO 1.

As is apparent from FIG. 21(a), the data corresponding to a number of frequency division is equal to M when no carry signal is generated, and the data of a number of frequency division is equal to M+1 when a carry signal is generated. Accordingly, average data is equal to (M+F/L) during L clock periods. Therefore, an output frequency of the VCO 1 is equal to an (M+F/L) multiple ((M+F/L)-fold or (M+F/L) times) of a frequency of a reference signal. Thus, the data of the fraction part F is changed, and this leads to the output frequency of the VCO 1 being set to an output frequency at an interval of 1/L of the frequency of the reference signal.

In the frequency synthesizer apparatus which utilizes the delta-sigma modulator circuit of the prior art to realize an output frequency equaling a non-integral multiple of a reference signal frequency with decimal precision, the data of a number of frequency division periodically changes at an interval of a basic period of L clocks (a changing period $\Delta P$) as shown in FIG. 21(a). As shown in FIG. 21(b), an output signal of the phase comparator 3 varies according to the above-mentioned change. Thus, a spectrum of the control voltage to the VCO 1 changes as shown in FIG. 23. At this time, an output of the VCO 1 is frequency-modulated, and thus the spectrum thereof changes as shown in FIG. 22.

As is apparent from FIG. 22, the spectrum of the output signal from the VCO 1 has high spurious components, i.e., a double side band signal having both side bands located at frequencies shifted upward and downward from a reference frequency by a changing frequency $\Delta f$ corresponding to the above-mentioned changing period $\Delta P$. When data of the fraction part F is small, this would cause a variation of low-frequency components of and a high spurious level. It is therefore difficult for the low-pass filter 4 to sufficiently reduce the spurious level.

SUMMARY OF THE INVENTION

An essential object of the present invention is to provide a frequency synthesizer apparatus which is capable of realizing an output frequency which is equal to a non-integral multiple of a reference signal frequency with decimal precision, and which is capable of reducing spurious components.

Another object of the present invention is to provide a communication apparatus and a frequency modulator apparatus using the above-mentioned frequency synthesizer apparatus.

A further object of the present invention is to provide a frequency modulating method using the above-mentioned frequency synthesizer apparatus.

According to one aspect of the present invention, there is provided a frequency synthesizer apparatus comprising:

a voltage control oscillator for generating an output signal having a frequency corresponding to an input control voltage;

a variable frequency divider for dividing the frequency of the output signal from the voltage control oscillator in accordance with an input data corresponding to a number of frequency division, and for outputting a frequency-divided signal;

a phase comparator for performing a phase comparison between the output signal from the variable frequency divider and an input reference signal, and generating and outputting a signal indicating a result of the phase comparison;

a low-pass filter for low-pass-filtering the signal from the phase comparator, and outputting the low-pass-filtered signal to the voltage control oscillator;

a fraction part control circuit for receiving an input data of a fraction part, for controlling the input data of the fraction part so as to periodically change the input data of the fraction part with a predetermined period and for outputting data of controlled fraction part; and an adder means for adding an input data of an integral part to the data of the controlled fraction part outputted from the fraction part control circuit, and for outputting resultant addition data to the variable frequency divider as the input data corresponding to a number of frequency division, wherein the fraction part control circuit is of a plural-n-th-order delta-sigma modulator circuit, the fraction part control circuit comprising:

a plural-n-th-order integrator, having one data input terminal and one data output terminal, for applying plural-n-th-order integration to input data of a fraction part, and outputting plural-n-th-order integrated data through the one data output terminal;

a quantizer for quantizing the data outputted from the one data output terminal of the plural-n-th-order integrator with a predetermined quantization step, and for outputting the quantized data as the data of the controlled fraction part; and a feedback circuit for feeding back the quantized data from the quantizer together with the input data of the fraction part to the plural-n-th-order integrator, and wherein the frequency synthesizer apparatus set a frequency of the output signal from the voltage control oscillator in accordance with an average value of the controlled input data of the fraction part of a period.

In the above-mentioned frequency synthesizer apparatus, the quantizer preferably generates data of an integral part of a quotient that is calculated by dividing the data outputted from the plural-n-th-order integrator by the predetermined quantization step, and outputs the generated data as the data of the controlled fraction part, and wherein the frequency synthesizer apparatus further comprises:

a first multiplier for multiplying data outputted from the feedback circuit by the quantization step, and for outputting resultant multiplication data; and a first adder for adding the data outputted from the first multiplier, to input data of a fraction part, and for outputting resultant addition data to the plural-n-th-order integrator.

In the above-mentioned frequency synthesizer apparatus, the fraction part control circuit is preferably a binary logic circuit for representing negative numbers in two's-complement form, wherein the predetermined quantization step is represented by a power of two, wherein the quantizer outputs data of higher-order bits indicating data equal to or larger than the quantization step among the quantized data, and wherein the plural-n-th-order integrator receives a combination of data of higher-order bits composed of the output data from the feedback circuit, and data of lower-order bits composed of the input data of the fraction part.

In the above-mentioned frequency synthesizer apparatus, either one of the reference signal or the output signal from the variable frequency divider is preferably used as a clock, wherein a transfer function of the plural-n-th-order integrator is expressed by $1/(1-z^{-1})^n$ using a z-transformation representing delay of one clock period as $z^{-1}$, and wherein a transfer function of the feedback circuit is expressed by $(1-z^{-1})^n-1$ using the z-transformation.

In the above-mentioned frequency synthesizer apparatus, the plural-n-th-order integrator preferably comprises a plurality of n first-order integrators which are cascade-connected, wherein each of the first-order integrators comprises a second adder and a one-clock delay circuit, wherein the second adder adds data inputted to each of the first-order integrators to output data from the one-clock delay circuit, and outputs resultant addition data as input data to the first-order integrator of the following stage, and wherein the one-clock delay circuit delays the output data from the second adder by one clock period and outputs the delayed data to the second adder.

In the above-mentioned frequency synthesizer apparatus, the plural-n-th-order integrator preferably comprises:

a second adder; and a composite delay circuit having a transfer function which is expressed by $1-(1-z^{-1})^n$ using a z-transformation representing delay of one clock as $z^{-1}$, and wherein the second adder adds data inputted to the plural-n-th-order integrator, to output data from the composite delay circuit, outputs resultant addition data to the composite delay circuit, and outputs the resultant addition data as output data from the plural-n-th-order integrator.

In the above-mentioned frequency synthesizer apparatus, either one of the reference signal or the output signal from the variable frequency divider is preferably used as a clock, wherein a transfer function of the plural-n-th-order integrator is expressed by $z^{-1}/(1-z^{-1})^n$ using a z-transformation representing delay of one clock period as $z^{-1}$, and wherein a transfer function of the feedback circuit is expressed by $((1-z^{-1})^n-1)/z^{-1}$ using the z-transformation.

In the above-mentioned frequency synthesizer apparatus, the plural-n-th-order integrator preferably comprises a plurality of n first-order integrators which are cascade-connected, wherein each of the first-order integrators comprises a second adder and a one-clock delay circuit, wherein the second adder adds data inputted to each of the first-order integrators to output data from the one-clock delay circuit, and outputs resultant addition data, wherein the one-clock delay circuit delays the output data from the second adder by one clock period, and outputs the delayed data, and wherein one of the plurality of n first-order integrators outputs the output data from the one-clock delay circuit of the first-order integrator to the first-order integrator of the following stage, whereas the other first-order integrators output the output data from the second adder to the first-order integrators of each following stage, respectively.

In the above-mentioned frequency synthesizer apparatus, the one-clock delay circuit of a first stage among the plurality of n first-order integrators preferably operates using a first clock, wherein at least one of the one-clock delay circuits of a second stage and stages following to the second stage among the plurality of n first-order integrators operates using a second clock, and wherein a period of the first clock is substantially equal to that of the second clock, and a leading edge or trailing edge of the first clock is substantially different from that of the second clock.

In the above-mentioned frequency synthesizer apparatus, each of the cascade-connected first-order integrators is preferably a binary logic circuit, and wherein a bit length of at least one of the first-order integrators of a second stage and stages following to the second stage is smaller than that of the first-order integrators of a first stage.

In the above-mentioned frequency synthesizer apparatus, the plural-n-th-order integrator preferably comprises:

a second adder;

a one-clock delay circuit; and a composite delay circuit having a transfer function which is expressed by $(1-(1-z^{-1})^n)/z^{-1}$ using a z-transformation representing delay of one clock period as $z^{-1}$, and wherein the second adder adds data inputted to the plural-n-th-order integrator, to output data from the composite delay circuit, outputs resultant addition data to the composite delay circuit through the one-clock delay circuit, and outputs output data from the one-clock delay circuit as output data from the plural-n-th-order integrator.

In the above-mentioned frequency synthesizer apparatus, the fraction part control circuit preferably comprises:

a first delta-sigma modulator circuit;

a second delta-sigma modulator circuit; and a natural-number-n-th-order differential circuit having a transfer function which is expressed by $(1-z^{-1})n$ using a z-transformation for representing delay of one clock period as $z^{-1}$, wherein the first delta-sigma modulator circuit comprises:

a first integrator which is a natural-number-n-th-order integrator;

a first quantizer; and a first feedback circuit, wherein the second delta-sigma modulator circuit comprises:

a second integrator which is a natural-number-m-th-order integrator;

a second quantizer; and a second feedback circuit, wherein output data from the second quantizer of the second delta-sigma modulator circuit is inputted to the natural-number-n-th-order differential circuit, wherein the fraction part control circuit further comprises:

a second multiplier for multiplying output data from the first quantizer by a predetermined quantization step, and for outputting resultant multiplication data;

a first subtracter for subtracting the output data from the second multiplier from output data from the first integrator, and outputting resultant subtraction data to the second delta-sigma modulator circuit;

a delay for delaying the output data from the first quantizer of the first delta-sigma modulator circuit so as to be synchronized with a timing of output data from the natural-number-n-th-order differential circuit; and further adder means for adding the output data delayed by the delay to the output data from the natural-number-n-th-order differential circuit, and for outputting resultant addition data as output data from the fraction part control circuit, and wherein the fraction part control circuit operates as a plural-(n+m)-th-order delta-sigma modulator circuit.

In the above-mentioned frequency synthesizer apparatus, the first delta-sigma modulator circuit preferably operates using a first clock,
wherein the second delta-sigma modulator circuit operates using a second clock, and
wherein a period of the first clock is substantially equal to that of the second clock, and a leading or a trailing timing of the first clock is substantially different from that of the second clock.

In the above-mentioned frequency synthesizer apparatus, the first clock is preferably generated from one of the input reference signal and the output from the variable frequency divider, and the second clock is generated from another one thereof.

In the above-mentioned frequency synthesizer apparatus, the fraction part control circuit is preferably a binary logic circuit,
wherein a bit length indicating data less than the quantization step of the second quantizer in the output data from the second integrator is smaller than that indicating data less than the quantization step of the first quantizer in the output data from the first integrator.

In the above-mentioned frequency synthesizer apparatus, data having a number of bits indicating data less than the predetermined quantization step, which are selected among the output data from the one-clock delay circuit of each of the plurality of n cascade-connected first-order integrators, preferably are sequentially set so as to be equal to or less than the number of bits of the previous stages.

According to another aspect of the present invention, there is provided a communication apparatus comprising:
the above-mentioned frequency synthesizer apparatus;
a transmitting circuit; and
a receiving circuit,
wherein an output signal from the voltage control oscillator, which is an output signal from the frequency synthesizer apparatus, is supplied to the transmitting circuit and the receiving circuit as a local oscillation signal,
wherein the transmitting circuit transmits a radio signal via a frequency channel corresponding to a frequency of the local oscillation signal, and
wherein the receiving circuit receives a further radio signal via a further frequency channel corresponding to the frequency of the local oscillation signal.

According to a further aspect of the present invention, there is provided a frequency modulator apparatus comprising:
the above-mentioned frequency synthesizer apparatus; and
a third adder for adding the input data of the fraction part to input modulation data, and for outputting resultant addition data to the fraction part control circuit, thereby frequency-modulating an output signal from the voltage control oscillator of the frequency synthesizer apparatus in accordance with the modulation data.

According to a still further aspect of the present invention, there is provided a frequency modulating method using a frequency synthesizer apparatus, including the step of:
adding the input data of the fraction part to input modulation data, and outputting resultant addition data to the fraction part control circuit, thereby frequency-modulating an output signal from the voltage control oscillator of the frequency synthesizer apparatus in accordance with the modulation data.

Accordingly, according to the present invention, a higher-order delta-sigma modulator circuit is used, and this leads to the present invention having a unique, advantageous effect of being capable of setting the output frequency at frequency intervals shorter than the reference frequency, and being capable of obtaining an output signal by remarkably reducing undesired spurious components.

BRIEF DESCRIPTION OF THE DRAWINGS

These and other objects and features of the present invention will become clear from the following description when taken in conjunction with the preferred embodiments thereof with reference to the accompanying drawings throughout which like parts are designated by like reference numerals, and in which:

FIG. 21(a) is a timing chart showing a change over time in a number of frequency division inputted to a variable frequency divider 2, and FIG. 21(b) is a timing chart showing a change over time in a control voltage to a VCO 1;

DETAILED DESCRIPTION OF THE PREFERRED EMBODIMENTS

Figure 1:
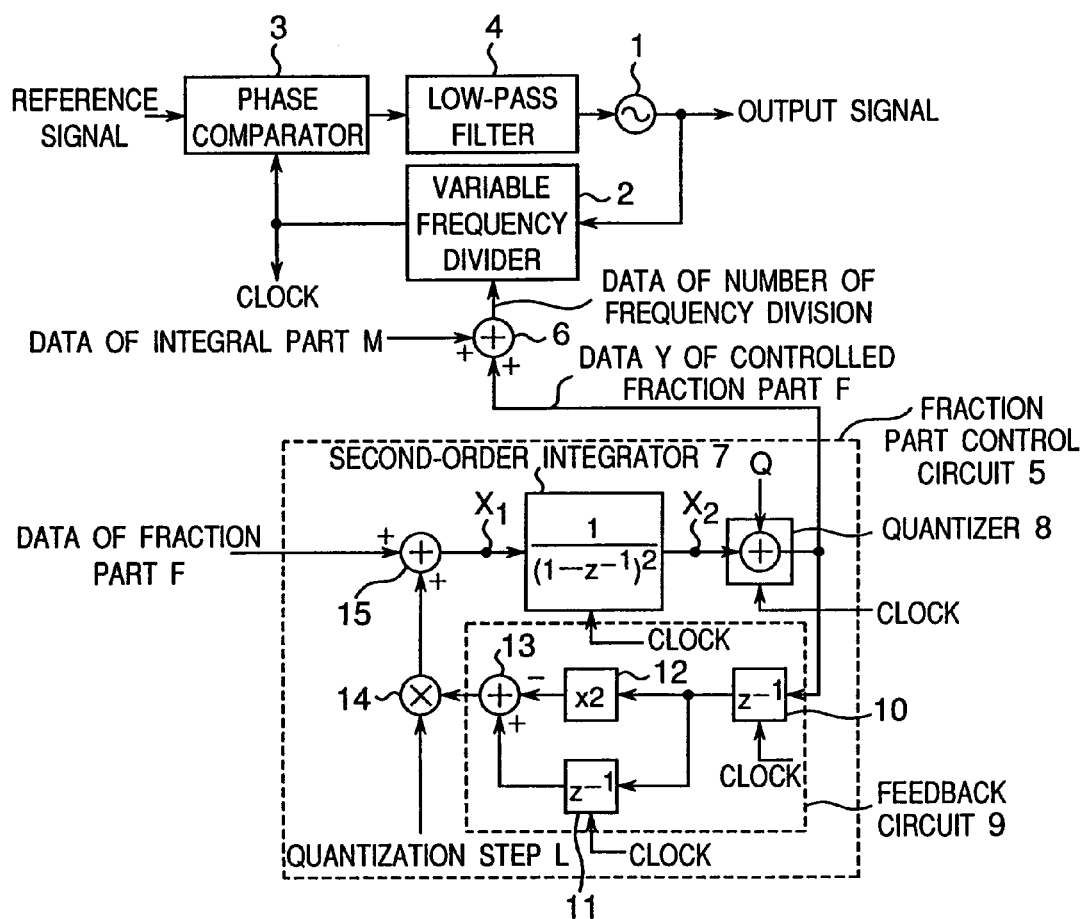
FIG. 1 is a block diagram showing a circuit configuration of a frequency synthesizer apparatus according to a first preferred embodiment of the present invention.

Preferred embodiments of the present invention will be described below with reference to the accompanying drawings. In the following preferred embodiments, the same circuit components are indicated by the same reference numerals and symbols, and the detailed description thereof is omitted.

First Preferred Embodiment

FIG. 1 is a block diagram showing a circuit configuration of a frequency synthesizer apparatus according to a first preferred embodiment of the present invention.

Referring to FIG. 1, the frequency synthesizer apparatus of the first preferred embodiment comprises a VCO 1, a variable frequency divider 2, a phase comparator 3, and a lowpass filter 4 comprising a loop filter, which are connected in a loop form. The frequency synthesizer apparatus further comprises a fraction part control circuit 5 and an adder 6. More particularly, the frequency synthesizer apparatus of the first preferred embodiment is characterized by comprising the fraction part control circuit 5 having not only a second-order integrator 7 but also a feedback circuit 9. The fraction part control circuit 5 provided in the frequency synthesizer apparatus including a PLL circuit is provided for controlling data of a fraction part F of data of a number of frequency division inputted to the variable frequency divider 2 of the PLL circuit.

As shown in FIG. 1, the variable frequency divider 2 applies frequency division to an output signal from the VCO 1 in accordance with data corresponding to a number of frequency division inputted from the adder 6, and then outputs the frequency-divided signal to the phase comparator 3. The phase comparator 3 performs a phase comparison between an input reference signal and the output signal from the variable frequency divider 2, and then outputs a signal indicating the result of the phase comparison to the VCO 1 through the low-pass filter 4. Thus, the PLL circuit is feedback-controlled so as to stabilize an output frequency of the VCO 1. On the other hand, the adder 6 adds data of an integral part M inputted from an external apparatus to data of the controlled fraction part F from the fraction part control circuit 5, and then outputs the resultant addition data to the variable frequency divider 2 as data corresponding to a number of frequency division.

The fraction part control circuit 5 comprises a second-order integrator 7, a quantizer 8, a feedback circuit 9, a multiplier 14 and an adder 15. The fraction part control circuit 5 controls input data of the fraction part F, and outputs data of the controlled fraction part F to the adder 6. In FIG. 1, Q denotes a quantization error to be added to data to be quantized by the quantizer 8. The data of the fraction part F inputted from the external apparatus is inputted to the adder 15. The adder 15 adds the data of the fraction part F to output data from the multiplier 14, and then outputs the resultant addition data to the second-order integrator 7 as input data $X_1$. As described above, Q, which is denoted as a quantization error, is added to the data to be quantized by the quantizer 8. As shown in FIG. 1, output data $X_2$ from the second-order integrator 7 is the data which is quantized by quantizer 8. Accordingly, the quantizer 8 quantizes the sum of the output data $X_2$ from the second-order integrator 7 and quantization error Q with a predetermined quantization step L, and then outputs the quantized output data to the feedback circuit 9 and the adder 6. The multiplier 14 multiplies output data from the feedback circuit 9 by the quantization step L, and then outputs the resultant multiplication data to the adder 15.

The feedback circuit 9 comprises two delay circuits 10 and 11, a double multiplier 12 and a subtracter 13, where the terms double multiplier mean a multiplier for multiplying input data by two. Output data from the quantizer 8 is inputted to the delay circuit 10, and output data from the delay circuit 10 is inputted to the delay circuit 11 and the double multiplier 12. The subtracter 13 subtracts output data from the double multiplier 12 from output data from the delay circuit 11, and then outputs the resultant subtraction data to the multiplier 14. The double multiplier 12 is provided for multiplying input data by 2 and outputting the doubled data. The double multiplier 12 can comprise a binary logic circuit for simply shifting bit data upward by one bit, thereby setting the least significant bit (LSB) to zero. By using an output signal from the variable frequency divider 2 as a clock, the delay circuits 10 and 11 delay their input data by one clock period and output the delayed data.

The fraction part control circuit 5 operates by using an output signal from the variable frequency divider 2 as a clock. Using a z-transformation for representing the delay of one clock as $z^{-1}$, a transfer function of the second-order integrator 7 is expressed by the following Equation (2):

$$1/(1-z^{-1})^2 \qquad (2).$$

Figure 2:
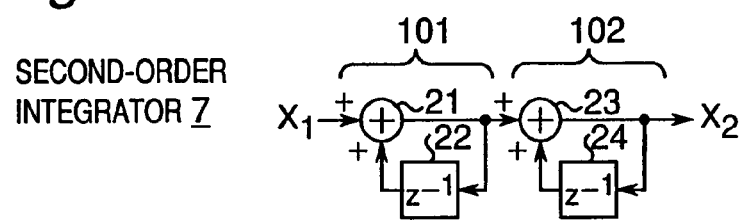
FIG. 2 is a block diagram showing a circuit configuration of a second-order integrator 7 shown in FIG. 1.

FIG. 2 is a block diagram showing a circuit configuration of the second-order integrator 7 shown in FIG. 1.

Referring to FIG. 2, an adder 21 and a delay circuit 22 constitute a first-order integrator 101. In FIG. 2 and in the following drawings, lines for supplying clocks to the delay circuits, the integrators and the quantizers are not shown. The adder 21 adds the input data $X_1$ to the output data from the delay circuit 22, and then outputs the resultant addition data to the delay circuit 22 and an adder 23 of the following stage. A transfer function of the first-order integrator 101 is expressed using the z-transformation by the following Equation (3):

$$1/(1-z^{-1}) \qquad (3).$$

Next, the adder 23 and a delay circuit 24 constitute a first-order integrator 102 of the following stage in a similar manner to the first-order integrator 101. The adder 23 adds data from the adder 21 to the data from the delay circuit 24, and then outputs the resultant addition data to the delay circuit 24. The resultant addition data from the adder 23 is also used as the output data $X_2$ from the second-order integrator 7. By using an output signal from the variable frequency divider 2 as a clock, the delay circuits 22 and 24 delay their input data by one clock period and output the delayed data.

Figure 3:
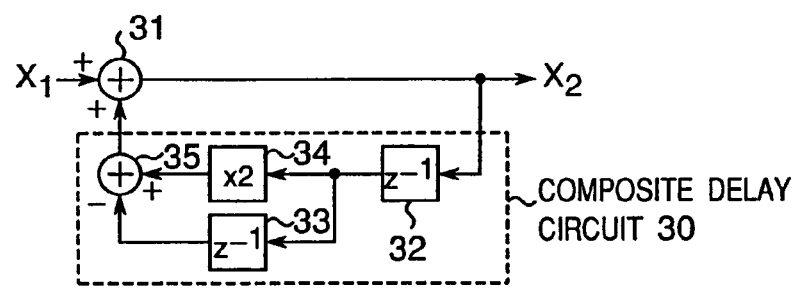
FIG. 3 is a block diagram showing a circuit configuration of a second-order integrator 7a of a modified preferred embodiment, replacing the second-order integrator 7 shown in FIG. 1.

FIG. 3 is a block diagram showing a circuit configuration of a second-order integrator 7a of a modified preferred embodiment, where the second-order integrator 7a replaces the second-order integrator 7 shown in FIG. 1.

Referring to FIG. 3, the second-order integrator 7a comprises an adder 31 and a composite delay circuit 30. The adder 31 adds the input data $X_1$ to the output data from the composite delay circuit 30, and then outputs the resultant addition data to a delay circuit 32 in the composite delay circuit 30. The resultant addition data from the adder 31 is also used as the output data $X_2$ from the second-order integrator 7a. The composite delay circuit 30 comprises two delay circuits 32 and 33, a double multiplier 34 and a subtracter 35. Each of the delay circuits 32 and 33 is provided for, by using an output signal from the variable frequency divider 2 as a clock, delaying the input data by one clock period and outputting the delayed data. The double multiplier 34 is provided for multiplying the input data by two, and for outputting the doubled data. An output from the adder 31, i.e., the input data to the composite delay circuit 30 is that inputted to the delay circuit 32, and output data from the delay circuit 32 is inputted to the delay circuit 33 and the double multiplier 34. Furthermore, the subtracter 35 subtracts the output data from the delay circuit 33 from the output data from the double multiplier 34, and then outputs the resultant subtraction data to the adder 31.

An operation of the frequency synthesizer apparatus of FIG. 1 configured as mentioned above will be described below.

Data of the integral part M inputted to the adder 6 is data of an integral part of a quotient that is calculated by dividing a desired output signal frequency by a reference signal frequency. Data of the fraction part F is data that is obtained by multiplying the resultant decimal data of the above-mentioned quotient by the quantization step L of the quantizer 8. The quantizer 8 outputs only data of an integral part of a quotient that is calculated by dividing the sum of the input data $X_2$ and the quantization error Q by the quantization step L. A transfer function of the feedback circuit 9 is expressed using the z-transformation by the following Equation (4):

$$z^{-2} - 2z^{-1} = (1-z^{-1})^2 - 1 \qquad (4).$$

Next, output data Y from the fraction part control circuit 5 is expressed using the z-transformation by the following Equation (5):

$$Y = F/L + Q(1-z^{-1})^2 \qquad (5).$$

As is apparent from the above Equation (5), the fraction part control circuit 5 operates as a second-order delta-sigma modulator circuit. Data corresponding to a number of frequency division inputted to the variable frequency divider 2 is the sum of the data of the integral part M and the output data from the fraction part control circuit 5, i.e., the data of the controlled fraction part F. The data corresponding to the number of frequency division changes according to a change in the output data from the fraction part control circuit 5. However, the average of the data of the number of frequency division is M+F/L since an average value of the term $Q(1-z^{-1})^2$ of the above Equation (5) is equal to zero. Therefore, the data of the fraction part F is changed, and this leads to the data of the number of frequency division to be changed in a unit of 1/L, and thus, the output signal frequency of the VCO 1 can be set at an interval of 1/L of the frequency of the reference signal.

On the other hand, frequency characteristics for amplitude $|1-z^{-1}|$ of the transfer function using the z-transformation are expressed by $|2 \sin(\pi f/f_s)|$, where $f_s$ denotes a clock frequency and is equal to the frequency of the reference signal. In the circuit configuration of FIG. 1 comprising the second-order integrator 7, the quantization error Q of an output signal is multiplied by frequency characteristics $|2 \sin(\pi f/f_s)|^2$.

Figure 18:
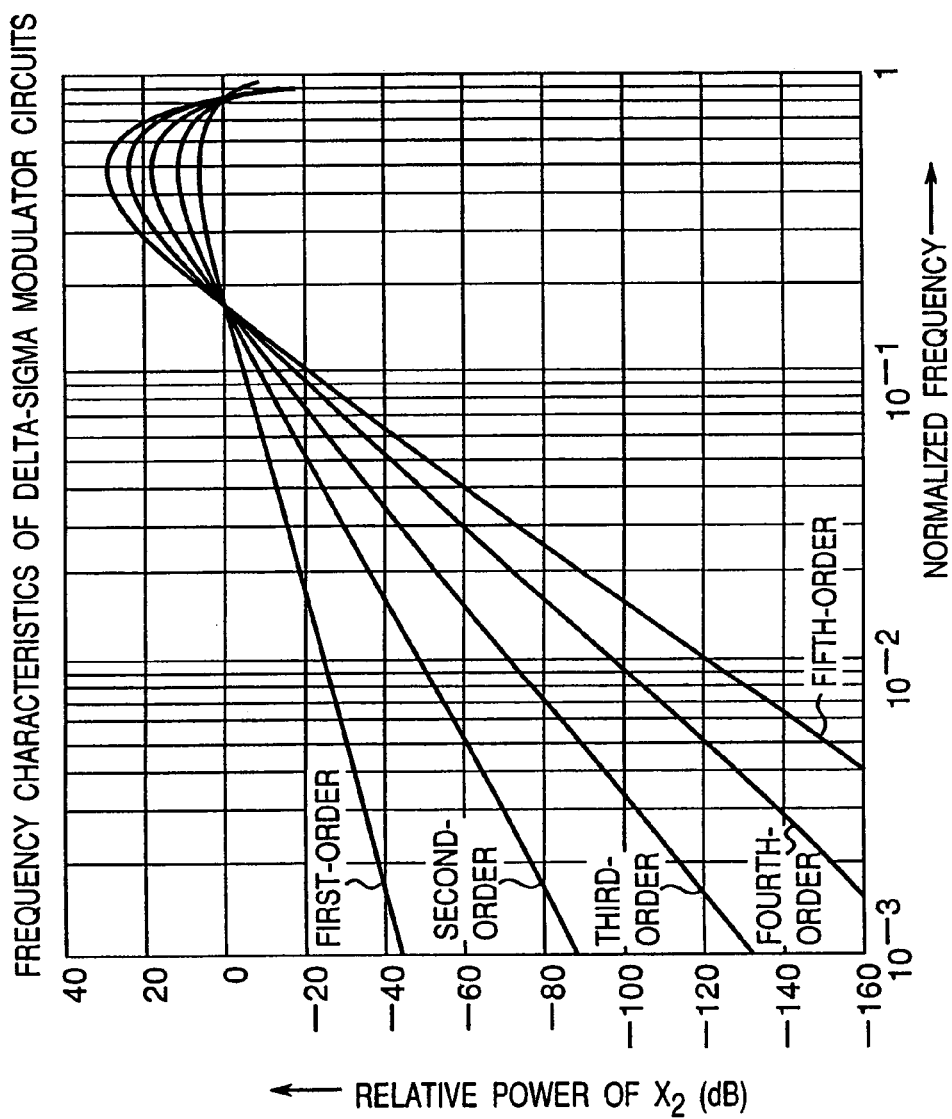
FIG. 18 is a spectrum chart showing frequency characteristics of delta-sigma modulator circuits of respective orders according to the preferred embodiments.
Figure 19:
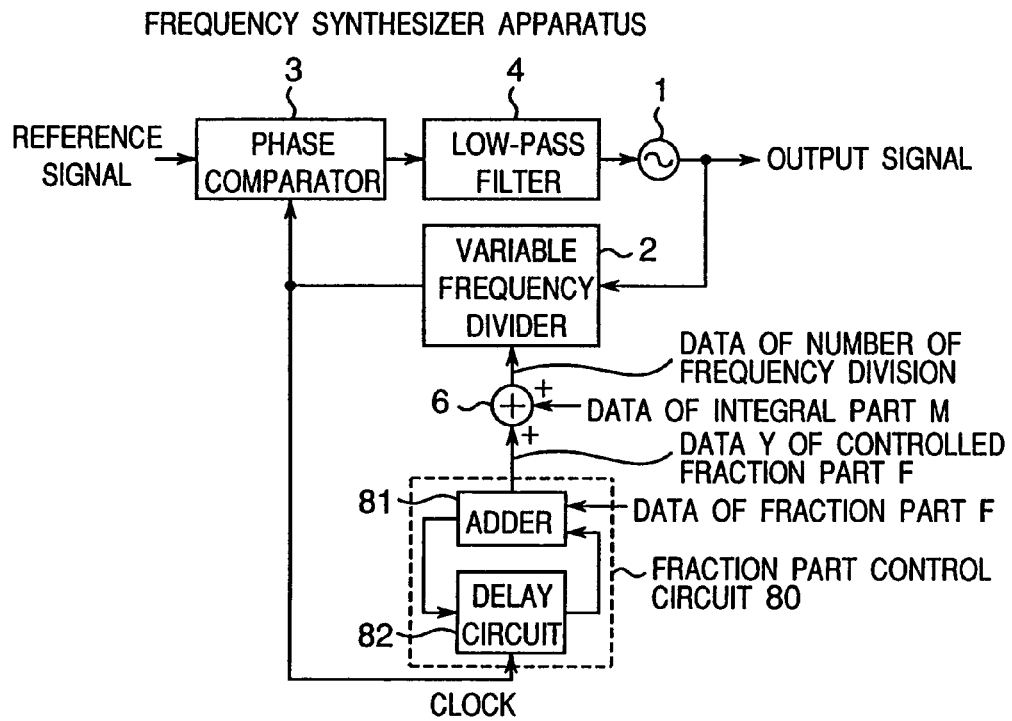
FIG. 19 is a block diagram showing a circuit configuration of a frequency synthesizer apparatus of the prior art.
Figure 20:
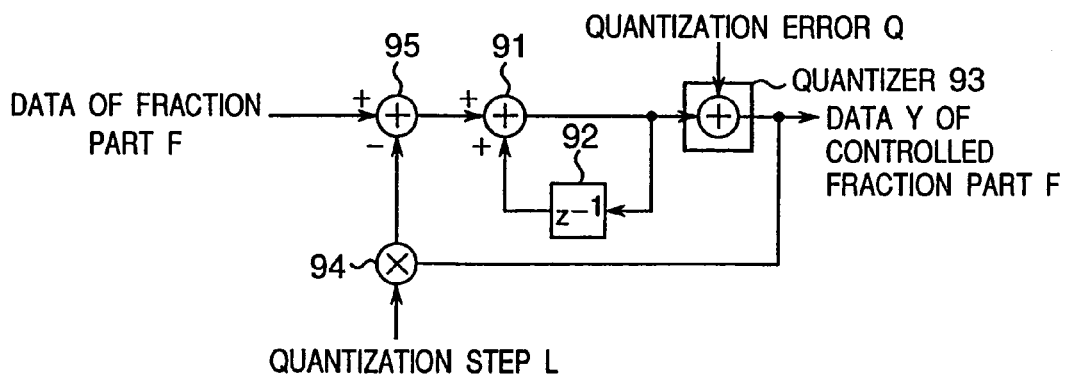
FIG. 20 is a block diagram of a detailed configuration of a fraction part control circuit 80 shown in FIG. 19.
Figure 21:
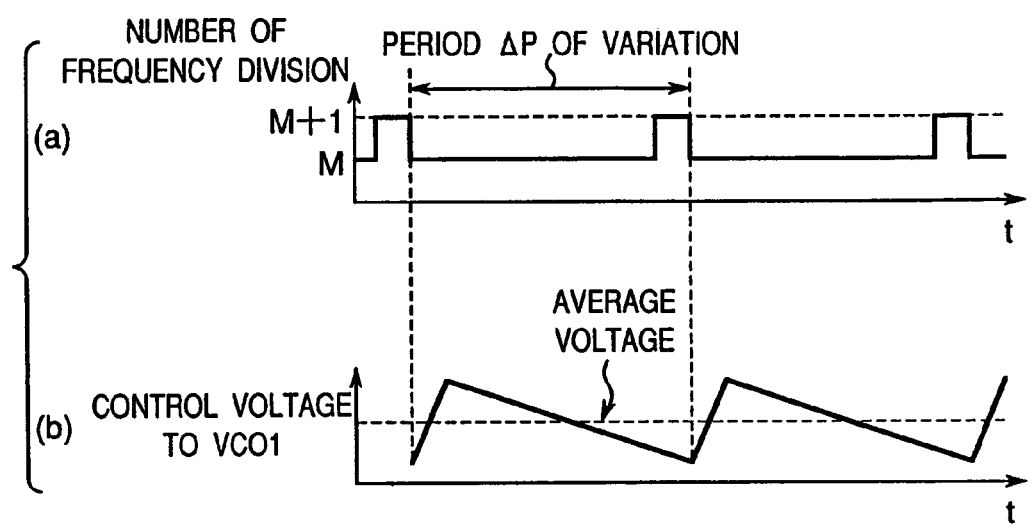
FIG. 21 is a timing chart showing an operation of the frequency synthesizer apparatus shown in FIG. 19, where
Figure 22:
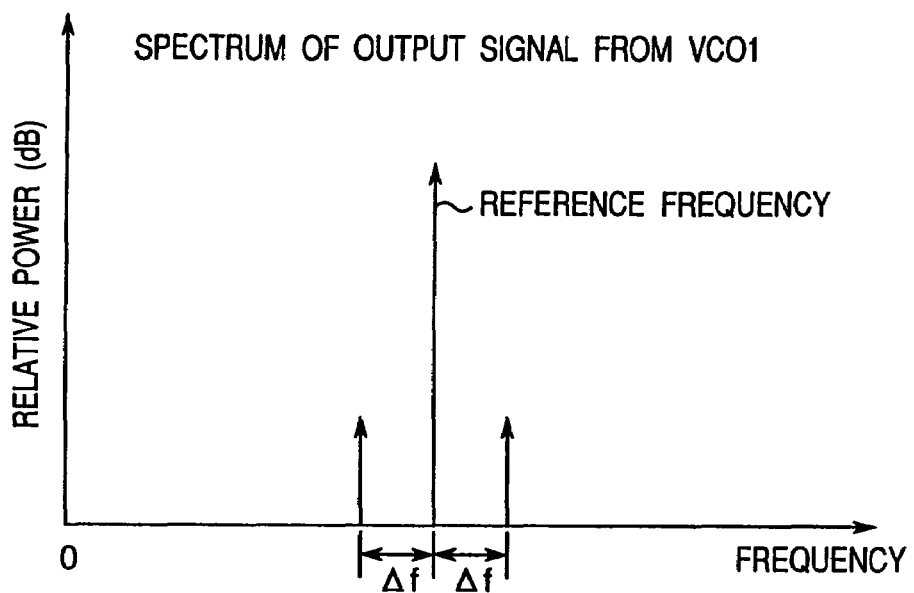
FIG. 22 is a spectrum chart showing frequency characteristics of an output signal from the VCO 1 shown in FIG. 19.
Figure 23:
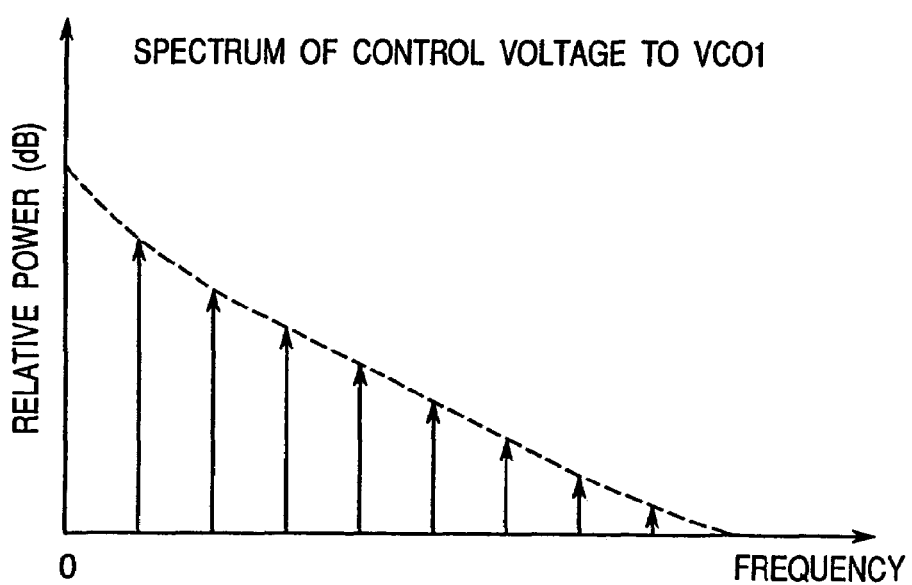
FIG. 23 is a spectrum chart showing frequency characteristics of a control voltage to the VCO 1 shown in FIG. 19.

FIG. 18 shows frequency characteristics of delta-sigma modulator circuits of respective orders according to the preferred embodiments. As is apparent from FIG. 18, a coefficient by which the second-order delta-sigma modulator circuit multiplies the quantization error Q has a higher degree of reduction of the quantization error in a range of low frequencies as compared with a coefficient by which a first-order delta-sigma modulator circuit multiplies the quantization error Q. As characteristics of the quantization error Q, the first-order delta-sigma modulator circuit has a strong periodic component having a period which is equal to an L multiple or L times of a period of the clock, but the second-order delta-sigma modulator circuit has a low periodic component. Therefore, the second-order delta-sigma modulator circuit is used, and this leads to a change in the data of the number of frequency division, which thereby causes a reduction in low frequency components and an increase in high frequency components.

The change in the data of the number of frequency division causes a change in the phase of the output signal from the variable frequency divider 2. The phase comparator 3 extracts components of the change. The low-pass filter 4 reduces high frequency components. Therefore, in undesired components which are generated due to the change in the data of the number of frequency division, their level decreases from the low frequency component to the high frequency component. Consequently, the undesired signal which is applied to the VCO1 becomes small, and this leads to remarkably reducing spurious components caused by frequency modulation.

Second Preferred Embodiment

Figure 4:
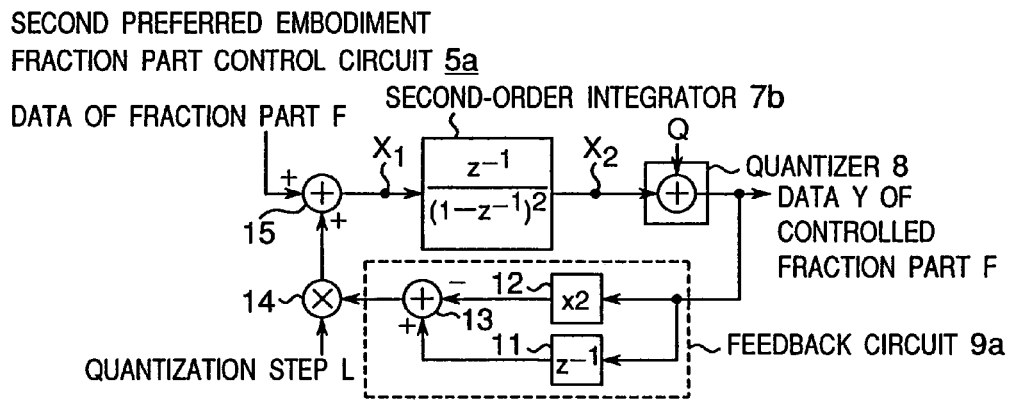
FIG. 4 is a block diagram showing a circuit configuration of a fraction part control circuit 5a according to a second preferred embodiment of the present invention.

FIG. 4 is a block diagram showing a circuit configuration of a fraction part control circuit 5a according to a second preferred embodiment of the present invention. In the second preferred embodiment, the circuit configuration, excluding the fraction part control circuit 5a, is the same as the circuit configuration shown in FIG. 1.

Referring to FIG. 4, the fraction part control circuit 5a according to the second preferred embodiment comprises a second-order integrator 7b, a quantizer 8, a feedback circuit 9a, a multiplier 14 and an adder 15. As compared with the fraction part control circuit 5 shown in FIG. 1, the fraction part control circuit 5a according to the second preferred embodiment is characterized in the delay circuit 10 is located in the second-order integrator 7b instead of the feedback circuit 9. That is, as compared with the fraction part control circuit 5 shown in FIG. 1, the fraction part control circuit 5a has the same circuit configuration and the same operation as those of the fraction part control circuit 5, except that the circuit configurations of the second-order integrator 7b and the feedback circuit 9a differ from those of the second-order integrator 7 and the feedback circuit 9.

As shown in FIG. 4, the adder 15 adds data of a fraction part F inputted from an external apparatus to the output data from the multiplier 14, and then outputs resultant addition data to the second-order integrator 7b. The quantizer 8 quantizes the output data from the second-order integrator 7b, and then inputs the quantized output data to the feedback circuit 9a. The quantized output data is also used as the data of the controlled fraction part F. The output data from the feedback circuit 9a is inputted to the multiplier 14. The multiplier 14 multiplies the output data from the feedback circuit 9a by a quantization step L, and then outputs the resultant multiplication data to the adder 15. The feedback circuit 9a comprises a delay circuit 11, a double multiplier 12 and a subtracter 13. The output data from the quantizer 8 is inputted to the delay circuit 11 and the double multiplier 12. The subtracter 13 subtracts the output data from the double multiplier 12 from the output data from the delay circuit 11, and then outputs the resultant subtraction data to the multiplier 14. In the second preferred embodiment, a transfer function of the second-order integrator 7b is expressed by the following Equation (6) using the z-transformation for representing a delay of one clock period as $z^{-1}$:

$$z^{-1}/(1-z^{-1})^2 \quad (6).$$

Figure 5:
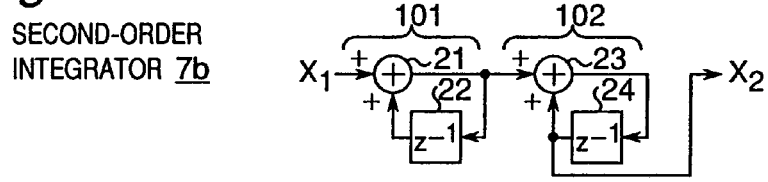
FIG. 5 is a block diagram showing a circuit configuration of a second-order integrator 7b shown in FIG. 4.

FIG. 5 is a block diagram showing a circuit configuration of the second-order integrator 7b shown in FIG. 4.

Referring to FIG. 5, an adder 21 and a delay circuit 22 constitute a first-order integrator 101. The adder 21 adds the input data $X_1$ to the output data from the delay circuit 22, and then outputs the resultant addition data to the delay circuit 22 and an adder 23 of the following stage. A transfer function of the first-order integrator 101 is expressed using the z-transformation by the following Equation (7):

$$1/(1-z^{-1}) \quad (7).$$

Next, the adder 23 and a delay circuit 24 constitute a first-order integrator 102 of the following stage in a similar manner to the first-order integrator 101. The output data from the adder 21 is inputted to the adder 23. The adder 23 adds the output data from the adder 21 to output data from the delay circuit 24, and then outputs the resultant addition data to the delay circuit 24. The output data from the delay circuit 24 is inputted to the adder 23, and is also used as the output data $X_2$ from the second-order integrator 7b. Each of the delay circuits 22 and 24 delays input data by one clock period, and outputs the delayed data. Since the output data from the delay circuit 24 is used as the output data from the second-order integrator 7b, a transfer function of the whole circuit of the second-order integrator 7b is expressed using the z-transformation by the following Equation (8):

$$z^{-1}/(1-z^{-1})^2 \quad (8).$$

Figure 6:
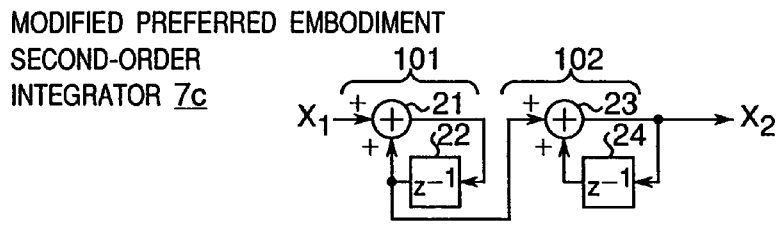
FIG. 6 is a block diagram showing a circuit configuration of a second-order integrator 7c of a modified preferred embodiment in which the second-order integrator 7c replaces the second-order integrator 7b shown in FIG. 4.

FIG. 6 is a block diagram showing a circuit configuration of a second-order integrator 7c of a modified preferred embodiment in which the second-order integrator 7c replaces the second-order integrator 7b shown in FIG. 4. As compared with the second-order integrator 7b shown in FIG. 5, the second-order integrator 7c shown in FIG. 6 is characterized in that two first-order integrators 101 and 102 are connected in a different manner, specifically, that the output data from the delay circuit 22 is inputted to an adder 23 of the following stage.

Referring to FIG. 6, an adder 21 and a delay circuit 22 constitute a first-order integrator 101. The adder 21 adds the input data $X_1$ to the output data from the delay circuit 22, and then outputs the resultant addition data to the adder 21 and the adder 23 through the delay circuit 22. A transfer function of the first-order integrator 101 is expressed using the z-transformation by the following Equation (9):

$$1/(1-z^{-1}) \quad (9).$$

Next, the adder 23 and a delay circuit 24 constitute the first-order integrator 102 of the following stage in a similar manner to the first-order integrator 101. The adder 23 adds the output data from the delay circuit 22 to the output data from the delay circuit 24, and then outputs the resultant addition data to the adder 23 through the delay circuit 24. The resultant addition data from adder 23 is also used as the output data $X_2$ from the second-order integrator 7c. In the circuit configuration of the second-order integrator 7c of FIG. 6 configured as described above, since the output data from the delay circuit 22 is used as the output data from the first-order integrator 101 of the first stage, a transfer function of the whole circuit of the second-order integrator 7c is expressed using the z-transformation by the following Equation (10):

$$z^{-1}/(1-z^{-1})^2 \quad (10).$$

In the second-order integrator 7b and 7c shown in FIGS. 5 and 6, respectively an output signal from the variable frequency divider 2 is used as a clock to the first-order integrator 101 and a clock to the first-order integrator 102. However, the present invention is not limited to the above-mentioned example. Two clocks, which are synchronized with the reference signal or the output signal from the variable frequency divider 2, having substantially the same period and differ from each other in leading or trailing timing may be used. This has an advantageous effect of preventing such a phenomenon where an instantaneous operating current is intensively fed at the timing when the circuits constituting the fraction part control circuit 5a operate at the simultaneous timing, which thereby leads to a large change in the voltage of the power supply.

Figure 7:
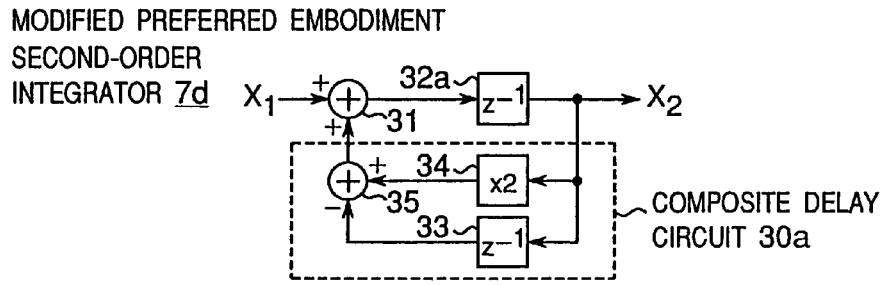
FIG. 7 is a block diagram showing a circuit configuration of a second-order integrator 7d of a modified preferred embodiment in which the second-order integrator 7d replaces the second-order integrator 7b shown in FIG. 4.

FIG. 7 is a block diagram showing a circuit configuration of a second-order integrator 7d of a modified preferred embodiment in which the second-order integrator 7d replaces the second-order integrator 7b shown in FIG. 4.

Referring to FIG. 7, the second-order integrator 7d comprises an adder 31, a delay circuit 32a and a composite delay circuit 30a. As compared with the second-order integrator 7a shown in FIG. 3, the second-order integrator 7d shown in FIG. 7 is characterized in that the delay circuit 32 of the composite delay circuit 30 is replaced by the delay circuit 32a interposed between the adder 31 and a connect point between an output terminal of the second-order integrator 7d and the composite delay circuit 30a.

As shown in FIG. 7, the adder 31 adds the input data $X_1$ to the output data from the subtracter 35 of the composite delay circuit 30a, and then outputs the resultant addition data to the delay circuit 33 and the double multiplier 34 of the composite delay circuit 30a through the delay circuit 32a. The output data from the delay circuit 32a is used as the output data $X_2$ from the second-order integrator 7d. The composite delay circuit 30a comprises a delay circuit 33, a double multiplier 34 and a subtracter 35. The subtracter 35 subtracts the output data from the delay circuit 33 from the output data from the double multiplier 34, and then outputs the resultant subtraction data to the adder 31. A transfer function of the whole circuit of the second-order integrator 7d of FIG. 7 configured as described above is expressed using the z-transformation by the following Equation (11):

$$z^{-1}/(1-z^{-1})^2 \quad (11).$$

An operation of the fraction part control circuit 5a of FIG. 4 according to the second preferred embodiment configured as mentioned above will be described below. Similar to the description above with reference to FIG. 1, the quantizer outputs only an integral part of a quotient that is calculated by dividing the sum of the input data $X_2$ and the quantization error Q by the quantization step L. A transfer function of the feedback circuit 9a is expressed using the z-transformation by the following Equation (12):

$$z^{-1}-2=((1-z^{-1})^2-1)/z^{-1} \quad (12).$$

A transfer function of the second-order integrator 7b (7c or 7d) is expressed using the z-transformation by the following Equation (13):

$$z^{-1}(1-z^{-1})^2 \quad (13).$$

Therefore, output data from the fraction part control circuit 5a shown in FIG. 4 is expressed using the z-transformation by the following Equation (14):

$$Y=z^{-1}F/L+Q(1-z^{-1})^2 \quad (14).$$

As is apparent from the above Equation (14), the output data Y from the fraction part control circuit 5a is only delayed by one clock period and is represented in the same notation as that of the fraction part control circuit 5 shown in FIG. 1. Thus, the fraction part control circuit 5a shown in FIG. 4 operates as a second-order delta-sigma modulator circuit. Therefore, in the frequency synthesizer apparatus using the fraction part control circuit 5a shown in FIG. 4, instead of using the fraction part control circuit 5 shown in FIG. 1, the output signal frequency can be set at an interval of 1/L of the frequency of the reference signal, and spurious components caused by frequency modulation can be remarkably reduced.

Third Preferred Embodiment

Figure 8:
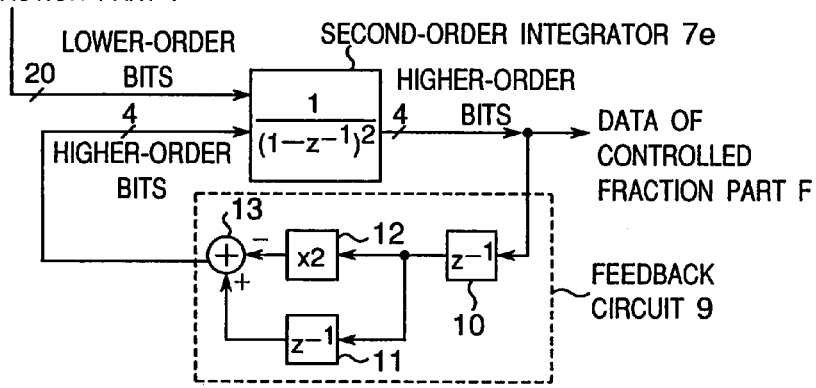
FIG. 8 is a block diagram showing a circuit configuration of a fraction part control circuit 5b according to a third preferred embodiment of the present invention.

FIG. 8 is a block diagram showing a circuit configuration of a fraction part control circuit 5b according to a third preferred embodiment of the present invention. The circuit configuration, excluding the fraction part control circuit 5b, is the same as the circuit configuration shown in FIG. 1. The fraction part control circuit 5b according to the third preferred embodiment comprises a second-order integrator 7e and a feedback circuit 9. The second-order integrator 7e and the feedback circuit 9 comprise the respective binary logic circuits, where negative numbers are represented in two's-complement form. A quantization step L is data indicated by a power of two. In the following preferred embodiments, it is assumed that the number of higher-order bits is equal to, for example, four bits and that the number of lower-order bits is equal to, for example, 20 bits. The present invention is not limited to the above-mentioned number of bits but may be limited to a predetermined number of bits.

Data in which lower-order bits are composed of data of a fraction part F inputted from an external apparatus and in which higher-order bits are composed of output data from the feedback circuit 9 is inputted to the second-order integrator 7e. The second-order integrator 7e applies second-order integration to the input data, and then, outputs the data of higher-order bits among the second-order integrated data, corresponding to digits equal to or larger than the quantization step L, to the delay circuit 10 of the feedback circuit 9. The second-order integrator 7e also outputs the data of higher-order bits as data of the controlled fraction part from the fraction part control circuit 5b. The feedback circuit 9 comprises two delay circuits 10 and 11, a double multiplier 12 and a subtracter 13. The output data of higher-order bits from the second-order integrator 7e is inputted to the delay circuit 11 and the double multiplier 12 through the delay circuit 10. The subtracter 13 subtracts the output data from the double multiplier 12 from the output data from the delay circuit 11, and then outputs the resultant subtraction data to the second-order integrator 7e as the data of higher-order bits. The second-order integrator 7e may have the circuit configuration of the second-order integrator 7 shown in FIG. 2 or the circuit configuration of the second-order integrator 7a shown in FIG. 3.

Basically, the fraction part control circuit 5b shown in FIG. 8 for the frequency synthesizer apparatus configured as described above can be considered to have the same circuit configuration as the fraction part control circuit 5 shown in FIG. 1. The quantization step L is data indicated by a power of two, and this leads to the quantizer being implemented by the circuit configuration for simply selecting only the higher-order bits indicating the data equal to or larger than the quantization step L among the output data from the second-order integrator 7e. The data of the selected higher-order bits is inputted and fed back to the feedback circuit 9, and the data is also used as the output data from the fraction part control circuit 5b. In a simple circuit configuration for combining the output data from the feedback circuit 9 as the higher-order bits with the data of the fraction part F and then inputting the combined data to the second-order integrator 7e, the circuit can operate in a manner similar to that of the multiplier 14 and the adder 15 shown in FIG. 1. A settable interval of the output signal frequency is limited to 1/(a power of two) or (one over a power of two) of the frequency of the reference signal, and thus the interval cannot be set to 1/(any integer) or (one over any integer). However, it is very significant that the configuration can be remarkably simplified.

Fourth Preferred Embodiment

Figure 9:
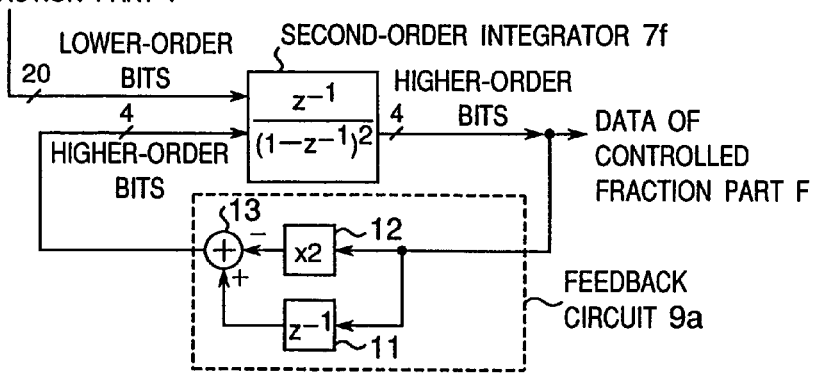
FIG. 9 is a block diagram showing a circuit configuration of a fraction part control circuit 5c according to a fourth preferred embodiment of the present invention.

FIG. 9 is a block diagram showing a circuit configuration of a fraction part control circuit 5c according to a fourth preferred embodiment of the present invention. The fourth preferred embodiment has such a circuit configuration that the same circuit configuration of the third preferred embodiment is applied to the fraction part control circuit 5a shown in FIG. 4. The fraction part control circuit 5c according to the fourth preferred embodiment comprises a second-order integrator 7f and a feedback circuit 9a. The second-order integrator 7f and the feedback circuit 9a comprise the respective binary logic circuits, where negative numbers are represented in two's-complement form. A quantization step L is data indicated by a power of two.

Data in which lower-order bits are composed of data of a fraction part F inputted from an external apparatus and in which higher-order bits are composed of the output data from the feedback circuit 9a is inputted to the second-order integrator 7f. The second-order integrator 7f applies second-order integration to the input data. Then, the second-order integrator 7f outputs some of the second-order integrated data, i.e., the data of higher-order bits corresponding to digits equal to or larger than the quantization step L, to the delay circuit 11 and the double multiplier 12 of the feedback circuit 9a. The second-order integrator 7f also outputs the data of higher-order bits as data of the controlled fraction part from the fraction part control circuit 5c.

The feedback circuit 9a comprises a delay circuit 11, a double multiplier 12 and a subtracter 13. The output data of higher-order bits from the second-order integrator 7f is inputted to the delay circuit 11 and the double multiplier 12. The subtracter 13 subtracts the output data from the double multiplier 12 from the output data from the delay circuit 11, and then outputs the resultant subtraction data to the second-order integrator 7f as the data of higher-order bits. The second-order integrator 7f may have the circuit configuration of the second-order integrator 7b shown in FIG. 5, the circuit configuration of the second-order integrator 7c shown in FIG. 6, or the circuit configuration of the second-order integrator 7d shown in FIG. 7.

Basically, the fraction part control circuit 5c shown in FIG. 9 for the frequency synthesizer apparatus configured as described above can be considered to have the same circuit configuration as the fraction part control circuit 5a shown in FIG. 4. The quantization step L is data indicated by a power of two, and this leads to the quantizer being implemented by the circuit configuration for simply selecting only the higher-order bits indicating the data equal to or larger than the quantization step L among the output data from the second-order integrator 7f. The data of the selected higher-order bits is inputted and fed back to the feedback circuit 9a, and the data is also used as output data from the fraction part control circuit 5c. In a simple circuit configuration for combining the output data from the feedback circuit 9a as the higher-order bits with the data of the fraction part F and then inputting the combined data to the second-order integrator 7f, the circuit operates in a manner similar to that of the multiplier 14 and the adder 15 shown in FIG. 4. A settable interval of the output signal frequency is limited to one over a power of two of the frequency of the reference signal, and thus the interval cannot be set to be one over any integer. However, it is very significant that the configuration can be remarkably simplified.

Fifth Preferred Embodiment

Figure 10:
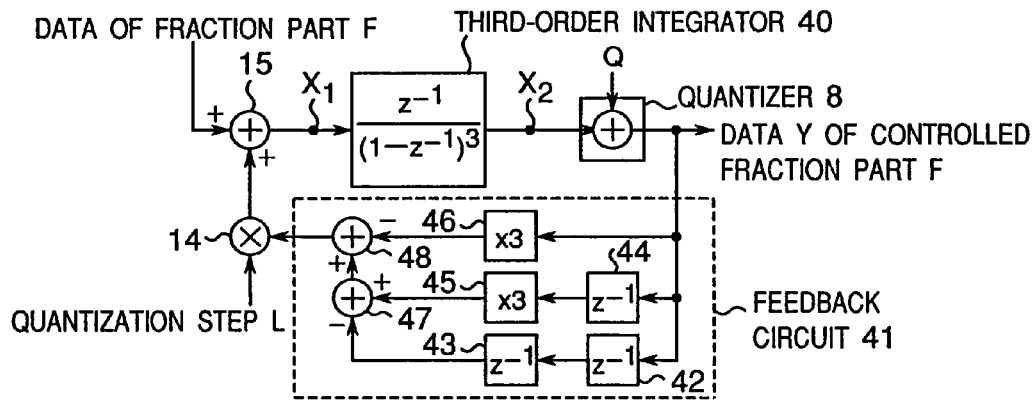
FIG. 10 is a block diagram showing a circuit configuration of a fraction part control circuit 5d according to a fifth preferred embodiment of the present invention.

FIG. 10 is a block diagram showing a circuit configuration of a fraction part control circuit 5d according to a fifth preferred embodiment of the present invention. The circuit configuration, excluding the fraction part control circuit 5d, is the same as the circuit configuration shown in FIG. 1.

Referring to FIG. 10, the fraction part control circuit 5d according to the fifth preferred embodiment comprises a third-order integrator 40, a quantizer 8, a feedback circuit 41, a multiplier 14 and an adder 15. As compared with the fraction part control circuit 5a shown in FIG. 4, the fraction part control circuit 5d has the same circuit configuration as the fraction part control circuit 5a except that the second-order integrator 7b is replaced with the third-order integrator 40, and that the feedback circuit 41 has a different circuit configuration.

Data of a fraction part F inputted from an external apparatus is inputted to the adder 15. The adder 15 adds the input data of the fraction part F to the output data from the multiplier 14, and then outputs the resultant addition data to the third-order integrator 40. The third-order integrator 40 applies third-order integration to the input data $X_1$, and then outputs the third-order integrated data $X_2$ to the quantizer 8. In response to the data $X_2$, the quantizer 8 quantizes the input data $X_2$ by a predetermined quantization step L. The quantized output data is fed back to the feedback circuit 41 and is used as data of the controlled fraction part F from the fraction part control circuit 5d. The feedback circuit 41 comprises three delay circuits 42, 43 and 44, two triple multipliers 45 and 46, and two subtracters 47 and 48, where the term triple multiplier means a multiplier for multiplying input data by three. The output data from the quantizer 8 is outputted to the subtracter 47 through the two delay circuits 42 and 43, and is outputted to the subtracter 47 through the delay circuit 44 and the triple multiplier 45. The output data from the quantizer 8 is also outputted to the subtracter 48 through the triple multiplier 46. The subtracter 47 subtracts the output data from the delay circuit 43 from the output data from the triple multiplier 45, and then outputs the resultant subtraction data to the subtracter 48. Then, the subtracter 48 subtracts the output data from the triple multiplier 46 from the output data from the subtracter 47, and then outputs the resultant subtraction data to the multiplier 14. Furthermore, the multiplier 14 multiplies the output data from the subtracter 48 by the quantization step L, and then outputs the resultant multiplication data to the adder 15.

In the preferred embodiment, a transfer function of the third-order integrator 40 is expressed by the following Equation (15) using the z-transformation for representing delay of one clock period as $z^{-1}$:

$$z^{-1}(1-z^{-1})^3 \qquad (15).$$

Figure 11:
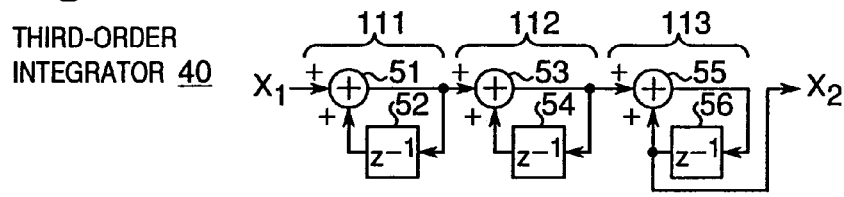
FIG. 11 is a block diagram showing a circuit configuration of a third-order integrator 40 shown in FIG. 10.

FIG. 11 is a block diagram showing a circuit configuration of the third-order integrator 40 shown in FIG. 10.

Referring to FIG. 11, an adder 51 and a delay circuit 52 constitute a first-order integrator 111. An adder 53 and a delay circuit 54 constitute a first-order integrator 112. An adder 55 and a delay circuit 56 constitute a first-order integrator 113. A transfer function of each of the first-order integrators 111, 112 and 113 is expressed using the z-transformation by the following Equation (16):

$$1/(1-z^{-1}) \qquad (16).$$

As shown in FIG. 11, the input data $X_1$ is added to the output data from the delay circuit 52 by the adder 51, and the output data from the adder 51 is inputted to the delay circuit 52 and is inputted to the adder 53 of the following stage. Subsequently, the adder 53 adds the output data from the adder 51 to the output data from the delay circuit 54, and then outputs the resultant addition data to the delay circuit 54 and the adder 55 of the following stage. Furthermore, the adder 55 adds the output data from the adder 53 to the output data from the delay circuit 56, and then outputs the resultant addition data to the adder 55 through the delay circuit 56. The output data from the delay circuit 56 is used as the output data $X_2$ from the third-order integrator 40. Each of the delay circuits 52, 54 and 56 delays the input data by one clock period, and then outputs the delayed data. Since the output data from the delay circuit 56 is used as the output data from the third-order integrator 40, a transfer function of the whole circuit of the third-order integrator 40 is expressed using the z-transformation by the following Equation (17):

$$z^{-1}(1-z^{-1})^3 \qquad (17).$$

In the third-order integrator 40 shown in FIG. 11, only the first-order integrator 113 of the final stage utilizes the output data from the delay circuit 56 as the output data from the first-order integrator 113. However, only the first-order integrator 111 of the first stage may utilize the output data from the delay circuit 52 as the output data from the first-order integrator 111. Alternatively, only the first-order integrator 112 of the second stage may utilize the output data from the delay circuit 54 as the output data from the first-order integrator 112. A transfer function of the third-order integrator 40 configured as described above is expressed using the z-transformation by the following Equation (18):

$$z^{-1}/(1-z^{-1})^3 \qquad (18).$$

Figure 12:
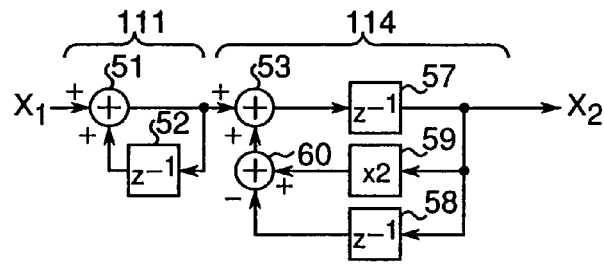
FIG. 12 is a block diagram showing a circuit configuration of a third-order integrator 40a of a modified preferred embodiment in which the third-order integrator 40a replaces the third-order integrator 40 shown in FIG. 11.

FIG. 12 is a block diagram showing a circuit configuration of a third-order integrator 40a of a modified preferred embodiment in which the third-order integrator 40a replaces the third-order integrator 40 shown in FIG. 11. The third-order integrator 40a is characterized in that a first-order integrator 111 is cascade-connected to a second-order integrator 114.

Referring to FIG. 12, an adder 51 and a delay circuit 52 constitute a first-order integrator 111. An adder 53, a subtracter 60, two delay circuits 57 and 58 and a double multiplier 59 constitute the second-order integrator 114. The second-order integrator 114 has the same circuit configuration as the second-order integrator 7d shown in FIG. 7, and thus the detailed description thereof is omitted. A transfer function of the first-order integrator 111 is expressed using the z-transformation by the following Equation (19):

$$1/(1-z^{-1}) \qquad (19).$$

The second-order integrator 114 is expressed using the z-transformation by the following Equation (20):

$$z^{-1}/(1-z^{-1})^2 \qquad (20).$$

Therefore, a transfer function of the whole circuit of the third-order integrator 40a shown in FIG. 12 is expressed using the z-transformation by the following Equation (21):

$$z^{-1}/(1-z^{-1})^3 \qquad (21).$$

In the third-order integrator 40 and 40a shown in FIGS. 11 and 12, respectively, an output signal from the variable frequency divider 2 is used as clocks to the first-order integrators 111, 112 and 113 and a clock to the second-order integrator 114. However, the present invention is not limited to the above-mentioned example. Three or two clocks (for the third-order integrator 40 shown in FIG. 11) or two clocks (for the third-order integrator 40a shown in FIG. 12), which are synchronized with the reference signal or the output signal from the variable frequency divider 2, having substantially the same period and differing from each other in leading or trailing timing may be used. This has an advantageous effect of preventing such a phenomenon where an instantaneous operating current is intensively fed at the timing when the circuits constituting the fraction part control circuit 5d operate at the simultaneous timing, and this leads to a large change in the voltage of the power supply.

Figure 13:
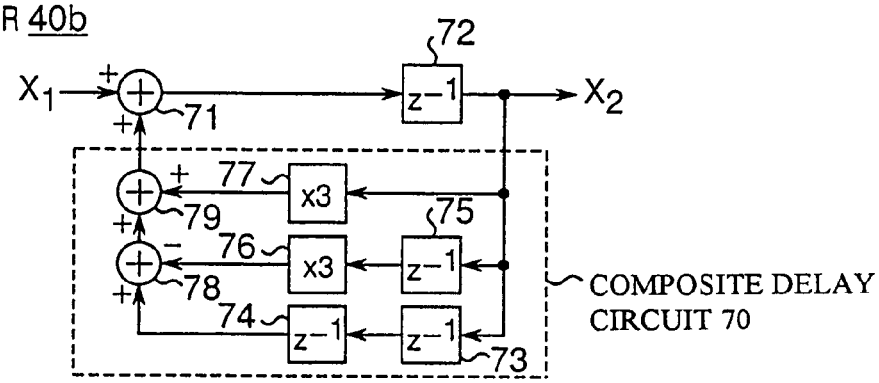
FIG. 13 is a block diagram showing a circuit configuration of a third-order integrator 40b of a modified preferred embodiment in which the third-order integrator 40b replaces the third-order integrator 40 shown in FIG. 11.

FIG. 13 is a block diagram showing a circuit configuration of a third-order integrator 40b of a modified preferred embodiment in which the third-order integrator 40b replaces the third-order integrator 40 shown in FIG. 11.

Referring to FIG. 13, the third-order integrator 40b comprises an adder 71, a delay circuit 72 and a composite delay circuit 70. As shown in FIG. 13, the adder 71 adds the input data $X_1$ to the output data from the composite delay circuit 70, and then outputs the result of this addition to the composite delay circuit 70 through the delay circuit 72. The output data from the delay circuit 72 is used as the output data $X_2$ from the third-order integrator 40b. The composite delay circuit 70 comprises three delay circuits 73, 74 and 75, two triple multipliers 76 and 77, a subtracter 78 and an adder 79. Each of the delay circuits 73, 74 and 75 is provided for delaying input data by one clock period and for outputting the delayed data. Each of the triple multipliers 76 and 77 is provided for multiplying input data by three and for outputting the multiplied data. The output data from the delay circuit 72 is outputted to the subtracter 78 through the two delay circuits 73 and 74 of the composite delay circuit 70, and is outputted to the subtracter 78 through the delay circuit 75 and the triple multiplier 76. The output data from the delay circuit 72 is also outputted to the adder 79 through the triple multiplier 77. Furthermore, the subtracter 78 subtracts the output data from the triple multiplier 76 from the output data from the delay circuit 74, and then outputs the resultant subtraction data to the adder 79. Furthermore, the adder 79 adds the output data from the subtracter 78 to the output data from the triple multiplier 77, and then outputs the resultant addition data to the adder 71.

A transfer function of the whole circuit of the third-order integrator 40b of FIG. 13 configured as described above is expressed using the z-transformation by the following Equation (22):

$$z^{-1}/(1-z^{-1})^3 \qquad (22).$$

An operation of the fraction part control circuit 5d of FIG. 10 according to the fifth preferred embodiment configured as mentioned above will be described below. The quantizer 8 outputs only data of an integral part of a quotient that is calculated by dividing the input data $X_2$ by the quantization step L. A transfer function of the feedback circuit 41 is expressed using the z-transformation by the following Equation (23):

$$-3+3z^{-1}-z^{-2} = ((1-z^{-1})^3-1)/z^{-1} \qquad (23).$$

A transfer function of the third-order integrator 40 is expressed using the z-transformation by the following Equation (24):

$$z^{-1}/(1-z^{-1})^3 \qquad (24).$$

Therefore, the output data from the fraction part control circuit 5d shown in FIG. 10 is expressed using the z-transformation by the following Equation (25):

$$Y = z^{-1}F/L + Q(1-z^{-1})^3 \qquad (25).$$

As is apparent from the above Equation (25), the fraction part control circuit 5d shown in FIG. 10 operates as a third-order delta-sigma modulator circuit.

As described above, frequency characteristics for the amplitude $|1-z^{-1}|$ of the transfer function using the z-transformation are expressed by $|2 \sin(\pi f/f_s)|$, where $f_s$ denotes a clock frequency and is equal to the frequency of the reference signal. In the third-order delta-sigma modulator circuit comprising the fraction part control circuit 5d shown in FIG. 10, the quantization error Q is therefore multiplied by frequency characteristics $|2 \sin(\pi f/f_s)|^3$. Consequently, as is apparent from the frequency characteristics of the delta-sigma modulator circuit shown in FIG. 18, the coefficient by which the third-order delta-sigma modulator circuit multiplies the quantization error Q becomes smaller in a range of the low frequencies than the coefficient by which the above-mentioned second-order delta-sigma modulator circuit multiplies the quantization error Q, and therefore, the degree of reduction of the quantization error further increases in the range of the low frequencies.

Accordingly, the frequency synthesizer apparatus using the fraction part control circuit 5d shown in FIG. 10, instead of the fraction part control circuit 5 shown in FIG. 1, has a unique advantageous effect of being capable of setting the output signal frequency at an interval of 1/L of the frequency of the reference signal, and is capable of more remarkably reducing spurious components caused by frequency modulation.

Sixth Preferred Embodiment

Figure 14:
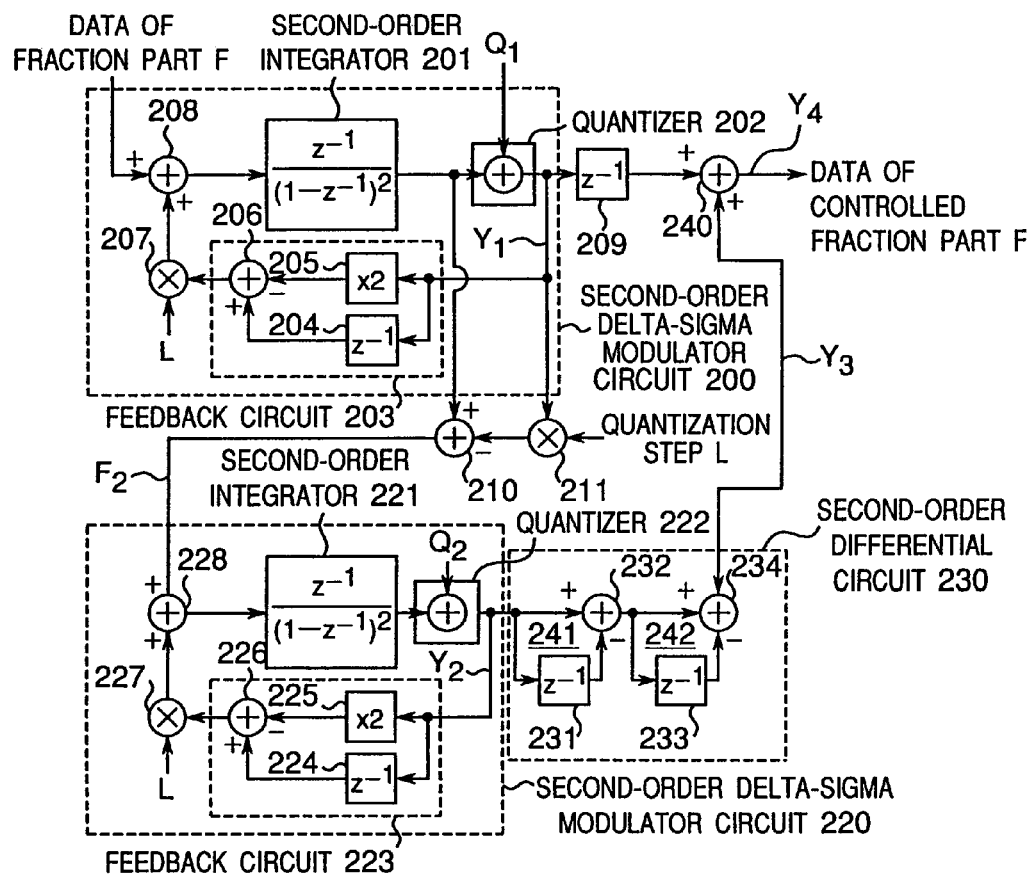
FIG. 14 is a block diagram showing a circuit configuration of a fraction part control circuit 5e according to a sixth preferred embodiment of the present invention.

FIG. 14 is a block diagram showing a circuit configuration of a fraction part control circuit 5e according to a sixth preferred embodiment of the present invention. The circuit configuration, excluding the fraction part control circuit 5e, is the same as the circuit configuration shown in FIG. 1. That is, the sixth preferred embodiment maintains the same circuit configuration of the frequency synthesizer apparatus of the first preferred embodiment as shown in FIG. 1, except that the fraction part control circuit 5e as shown in FIG. 14 replaces the fraction control circuit 5 as shown in FIG. 1.

Basically, the fraction part control circuit 5e shown in FIG. 14 has the circuit configuration using two second-order delta-sigma modulator circuits.

Referring to FIG. 14, the fraction part control circuit 5e comprises two second-order delta-sigma modulator circuits 200 and 220, a second-order differential circuit 230, a delay circuit 209, a subtracter 210, a multiplier 211 and an adder 240. As shown in FIG. 14, the second-order delta-sigma modulator circuit 200 comprises a second-order integrator 201, a quantizer 202, a feedback circuit 203, a multiplier 207 and an adder 208. The feedback circuit 203 comprises a delay circuit 204, a double multiplier 205 and a subtracter 206. The second-order delta-sigma modulator circuit 220 comprises a second-order integrator 221, a quantizer 222, a feedback circuit 223, a multiplier 227 and an adder 228. The feedback circuit 223 comprises a delay circuit 224, a double multiplier 225 and a subtracter 226. Each of the two second-order delta-sigma modulator circuits 200 and 220 has the same configuration as that of the fraction part control circuit 5a shown in FIG. 4, and thus the detailed description thereof is omitted.

Referring to FIG. 14 again, data of a fraction part F inputted from an external apparatus is inputted to the adder 208 of the second-order delta-sigma modulator circuit 200. The output data from the quantizer 202 of the second-order delta-sigma modulator circuit 200 is outputted to the multiplier 211 and is outputted to the adder 240 through the delay circuit 209. The multiplier 211 multiplies the output data from the quantizer 202 by a quantization step L, and then outputs the resultant multiplication data to the subtracter 210. The subtracter 210 subtracts the output data from the multiplier 211 from the output data from the second-order integrator 201 of the second-order delta-sigma modulator circuit 200, and then outputs the resultant subtraction data to the adder 228 of the second-order delta-sigma modulator circuit 220.

The output data from the quantizer 222 of the second-order delta-sigma modulator circuit 220 is outputted to the adder 240 through the second-order differential circuit 230. The second-order differential circuit 230 comprises a delay circuit 231, a subtracter 232, a delay circuit 233 and a subtracter 234. The delay circuit 231 and the subtracter 232 constitute a first-order differential circuit 241. The delay circuit 233 and the subtracter 234 constitute a first-order differential circuit 242. The second-order differential circuit 230 comprises the two first-order differential circuits 241 and 242, which are cascade-connected to each other. The output data from the quantizer 222 of the second-order delta-sigma modulator circuit 220 is inputted to the delay circuit 231 and the subtracter 232 of the second-order differential circuit 230. The subtracter 232 subtracts the output data from the delay circuit 231 from the input data to the second-order differential circuit 230, and then outputs the resultant subtraction data to the delay circuit 233 of the following stage and the subtracter 234. The subtracter 234 subtracts the output data from the delay circuit 233 from the output data from the subtracter 232 of the preceding stage, and then, outputs the resultant subtraction data to the adder 240.

Furthermore, the adder 240 adds the output data from the delay circuit 209 to the output data from the subtracter 234 of the second-order differential circuit 230. The resultant addition data from the adder 240 is used as the data of the controlled fraction part F, and is used as the output data from the whole circuit of the fraction part control circuit 5e.

An operation of the fraction part control circuit of FIG. 14 configured as mentioned above will be described below.

Assuming that a quantization error to be added by the quantizer 202 $Q_1$, an output data $Y_1$ from the second-order delta-sigma modulator circuit 200 is expressed using the z-transformation by the following Equation (26):

$$Y_1 = z^{-1} F/L + Q_1 (1-z^{-1})^2 \quad (26)$$

Assuming that the input data to the second-order delta-sigma modulator circuit 220 is $F_2$ and a quantization error to be added by the quantizer 222 is $Q_2$, an output data $Y_2$ from the second-order delta-sigma modulator circuit 220 is expressed using the z-transformation by the following Equation (27):

$$Y_2 = z^{-1} F_2/L + Q_2(1-z^{-1})^2 \quad (27),$$

where $$F_2 = -LQ_1 \quad (28).$$

Therefore, the following Equation (29) is obtained:

$$Y_2 = -z^{-1} Q_1 + Q_2(1-z^{-1})^2 \quad (29).$$

A transfer function of the second-order differential circuit 230 is expressed using the z-transformation by the following Equation (30):

$$(1-z^{-1})^2 \quad (30).$$

Therefore, an output data $Y_3$ from the second-order differential circuit 230 is expressed using the z-transformation by the following Equation (31):

$$\begin{aligned} Y_3 &= (1-z^{-1})^2 Y_2 \\ &= -z^{-1} Q_1 (1-z^{-1})^2 + Q_2 (1-z^{-1})^4. \end{aligned} \quad (31)$$

Therefore, an output data $Y_4$ from the adder 240 is expressed using the z-transformation by the following Equation (32):

$$\begin{aligned} Y_4 &= z^{-1} Y_1 + Y_3 \\ &= -z^{-2} F/L + Q_2(1-z^{-1})^4. \end{aligned} \quad (32)$$

As is apparent from the above Equation (32), the fraction part control circuit 5e shown in FIG. 14 operates as a fourth-order delta-sigma modulator circuit.

As described above, frequency characteristics for the amplitude $|1-z^{-1}|$ of the transfer function using the z-transformation are expressed by $|2 \sin(\pi f/f_s)|$, where $f_s$ denotes a clock frequency and is equal to the frequency of the reference signal. In the fourth-order delta-sigma modulator circuit shown in FIG. 14, the quantization error Q is therefore multiplied by frequency characteristics $|2 \sin(\pi f/f_s)|^4$. Consequently, as is apparent from the frequency characteristics of the delta-sigma modulator circuit shown in FIG. 18, the coefficient by which the fourth-order delta-sigma modulator circuit multiplies the quantization error Q becomes smaller in a range of the low frequencies than the coefficients by which the above-mentioned second-order and third-order delta-sigma modulator circuits multiply the quantization error Q, and therefore, the degree of reduction of the quantization error further increases in the range of the low frequencies.

Accordingly, the frequency synthesizer apparatus using the fraction part control circuit 5e shown in FIG. 14, instead of the fraction part control circuit 5 shown in FIG. 1, has a unique advantageous effect of being capable of setting the output signal frequency at an interval of 1/L of the frequency of the reference signal, and is capable of more remarkably reducing spurious components caused by frequency modulation.

In the above-described sixth preferred embodiment, a combination of the second-order delta-sigma modulator circuit 200, the second-order delta-sigma modulator circuit 220 and the second-order differential circuit 230 constitute the fourth-order delta-sigma modulator circuit. In general, when combining a natural-number-n-th-order delta-sigma modulator circuit with a natural-number-m-th-order delta-sigma modulator circuit, a natural-number-n-th-order differential circuit is provided in an output stage of the m-th-order delta-sigma modulator circuit, and a delay circuit is interposed into an output stage of the n-th-order delta-sigma modulator circuit so that the output data from the natural-number-n-th-order delta-sigma modulator circuit may be synchronized with the output data from the natural-number-n-th-order differential circuit. This then leads to a plural-(n+m)-th-order delta-sigma modulator circuit to be configured as a whole. In the preferred embodiment, each of "m" and "n" denotes a natural number equal to or larger than one. Therefore, the plural-(n+m)-th-order delta-sigma modulator circuit configured as described above may be used in the fraction part control circuit for the frequency synthesizer apparatus.

Seventh Preferred Embodiment

Figure 15:
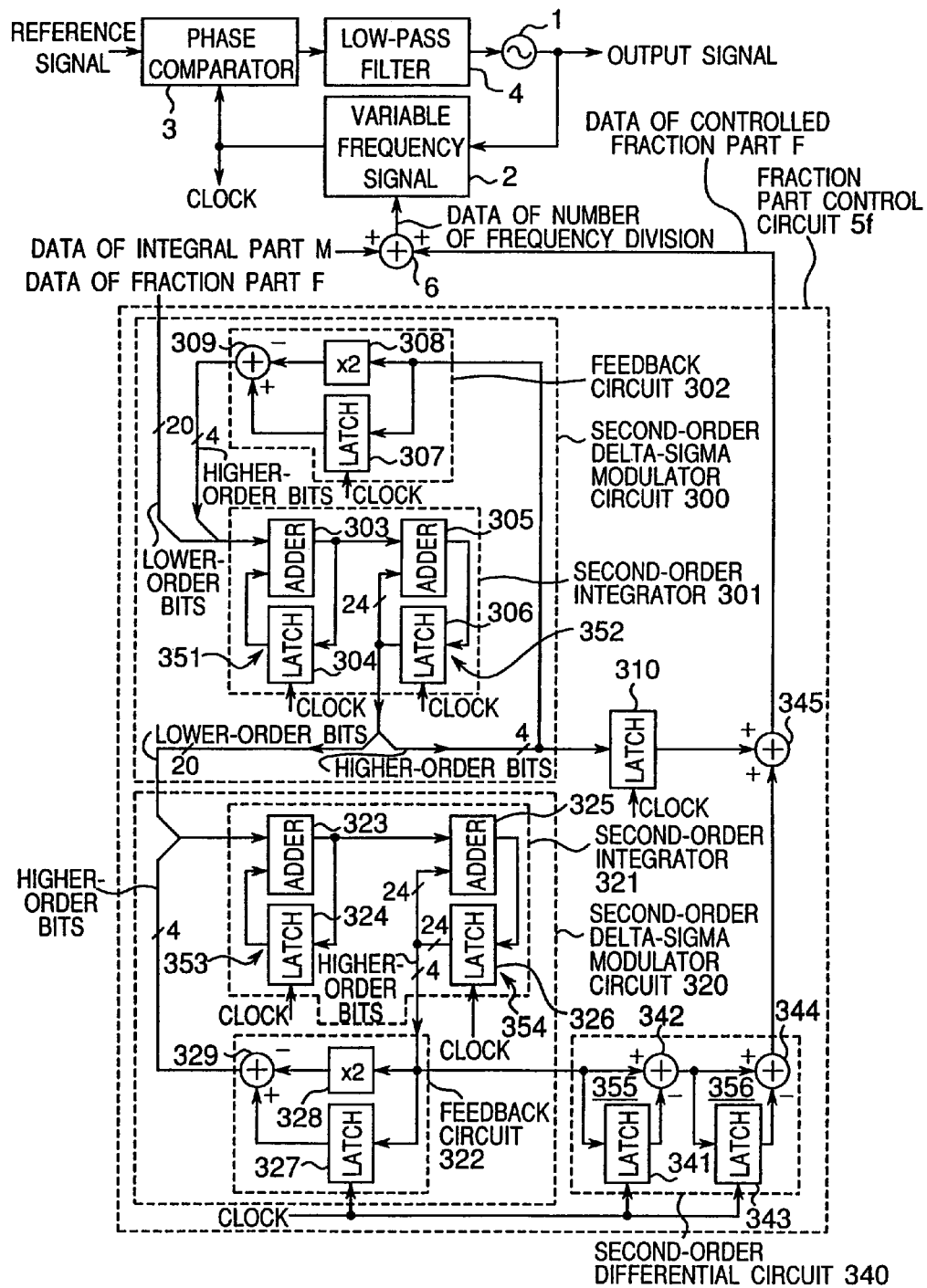
FIG. 15 is a block diagram showing a circuit configuration of a frequency synthesizer apparatus according to a seventh preferred embodiment of the present invention.

FIG. 15 is a block diagram showing a circuit configuration of a frequency synthesizer apparatus according to a seventh preferred embodiment of the present invention. In the present seventh preferred embodiment, the circuit configuration, excluding a fraction part control circuit 5f, is the same as the circuit configuration shown in FIG. 1. That is, the seventh preferred embodiment maintains the same circuit configuration of the frequency synthesizer apparatus of the first preferred embodiment as shown in FIG. 1, except that the fraction part control circuit 5f as shown in FIG. 15 replaces the fraction control circuit 5 as shown in FIG. 1. Thus, the same components are indicated by the same reference numerals and symbols, and the detailed description thereof is omitted. The fraction part control circuit 5f shown in FIG. 15 has the circuit configuration shown in FIG. 14, except that the second-order delta-sigma modulator circuit 200 and the second-order delta-sigma modulator circuit 220 shown in FIG. 14 are replaced, and thus the detailed description thereof is omitted. All latches 304, 306, 307, 324, 326, 327, 310, 341 and 343 shown in FIG. 15 correspond to delay circuits each delaying input data by one clock period. Each of the circuits constituting the fraction part control circuit 5f comprises a binary logic circuit, where negative numbers are represented in two's-complement form. A quantization step L is data indicated by a power of two.

Referring to FIG. 15, the fraction part control circuit 5f according to the seventh preferred embodiment comprises two second-order delta-sigma modulator circuits 300 and 320, a second-order differential circuit 340, a latch 310 and an adder 345. The second-order delta-sigma modulator circuit 300 comprises a second-order integrator 301 and a feedback circuit 302. The second-order integrator 301 comprises a cascaded connection of a first-order integrator 351, which is formed by an adder 303 and a latch 304, and a first-order integrator 352, which is formed by an adder 305 and a latch 306. The feedback circuit 302 comprises a latch 307, a double multiplier 308 and a subtracter 309. The second-order delta-sigma modulator circuit 320 comprises a second-order integrator 321 and a feedback circuit 322. The second-order integrator 321 comprises a cascaded connection of a first-order integrator 353, which is formed by an adder 323 and a latch 324, and a first-order integrator 354, which is formed by an adder 325 and a latch 326. The feedback circuit 322 comprises a latch 327, a double multiplier 328 and a subtracter 329. The second-order differential circuit 340 comprises a cascaded connection of a first-order differential circuit 355, which is formed by a subtracter 342 and a latch 341, and a first-order differential circuit 356, which is formed by a subtracter 344 and a latch 343.

The quantization step L is data indicated by a power of two, and this leads to the second-order delta-sigma modulator circuit 300 being a quantizer having the circuit configuration for simply selecting only higher-order bits indicating data equal to or larger than the quantization step L among output data from the second-order integrator 301. Data of the selected higher-order bits is inputted and fed back to the feedback circuit 302. Also, the data is used as the output data from the second-order delta-sigma modulator circuit 300, and is outputted to the adder 345 through the latch 310. In a simple circuit configuration for combining the output data from the feedback circuit 302 as the higher-order bits with data of a fraction part F and then using the combined data as the input data to the second-order integrator 301, the circuit operates in a manner similar to that of the multiplier 207 and the adder 208 shown in FIG. 14. Similarly, the second second-order delta-sigma modulator circuit 320 has a quantizer having such a circuit configuration of simply selecting only higher-order bits indicating data equal to or larger than the quantization step L among output data from the second-order integrator 321. Data of the selected higher-order bits is inputted and fed back to the feedback circuit 322, and also, the data thereof is used as the output data from the second-order delta-sigma modulator circuit 320 and is inputted to the second-order differential circuit 340. In a simple circuit configuration for combining the output data from the feedback circuit 322 as the higher-order bits with the input data to the second-order delta-sigma modulator circuit 320 (lower-order bits selected among output data from the second-order integrator 301 of the second-order delta-sigma modulator circuit 300) and then using the combined data as input data to the second-order integrator 321, the circuit operates in a manner similar to that of the multiplier 227 and the adder 228 shown in FIG. 14.

In the connection between the second-order delta-sigma modulator circuit 300 and the second second-order delta-sigma modulator circuit 320, data of lower-order bits less than the quantization step L, which are selected among the output data from the latch 306 of the second-order integrator 301, is inputted to the second-order integrator 321, and this leads to the operation of the multiplier 211 and the subtracter 210 shown in FIG. 14 being implemented. Furthermore, the output data from the second-order differential circuit 340 is inputted to the adder 345. The adder 345 adds two input data, and outputs the resultant addition data to the adder 6 as the data of the controlled fraction part F.

According to the frequency synthesizer apparatus of FIG. 15 configured as described above, a settable interval of the output signal frequency is limited to one over a power of two of the frequency of the reference signal, and thus, the interval cannot be set to one over any integer, but it is very significant that the circuit configuration can be remarkably simplified.

In the circuit configuration shown in FIG. 15, an output from the variable frequency divider 2 is used as a clock. However, the reference signal may also be used as a clock. The leading or trailing timing of a clock of the second-order delta-sigma modulator circuit 300 can differ from the leading or trailing timing of a clock of the second-order delta-sigma modulator circuit 320. This has an advantageous effect of preventing such a phenomenon where an instantaneous operating current is intensively fed at the timing when the circuits constituting the fraction part control circuit $5f$ operate at the simultaneous timing, and this leads to a large change in the voltage of the power supply. Besides a method for generating clocks having different timings by simply delaying one clock by a predetermined time interval among a plurality of clocks, there is a method in which, when the phase comparator 3 comprises an exclusive OR gate circuit in which the output timing of the variable frequency divider 2 does not match the timing of the reference signal in a normal stable state, the second-order delta-sigma modulator circuit 300 is operated by using the reference signal as a first clock and the second-order delta-sigma modulator circuit 320 is operated by using an output signal from the variable frequency divider 2 as a second clock. Alternatively, the configuration may be adapted to operate the latch 304 and the latch 324 by using the first clock and to operate the other circuits by using the second clock. Also, in this case, the same advantageous effects can be obtained.

Data having a number of bits indicating data less than the quantization step L, which are selected among the respective output data from the latches 304, 306, 324 and 326, can be sequentially set equal to or less than the number of bits of the previous stages. That is, a bit length of at least one of the first-order integrators of a second stage and stages following the second stage is smaller than a bit length of the first-order integrators of a first stage. The precision of data of a number of frequency division is determined in accordance with the number of bits of the adder 303 of the first stage and latch 304. Thus, the precision does not change even if the number of bits of the following adders and latches is reduced. Therefore, the bits are truncated starting with the least significant bit (LSB), and this leads to the circuit scale being reduced although more quantization errors are caused due to truncation. Since the later stage is less affected by the reduction in the circuit scale, the circuit scale of the later stage can be reduced more remarkably.

In the above-described seventh preferred embodiment, the fraction part control circuit $5f$ comprises a binary logic circuit, and a bit length indicating data less than the quantization step L of the quantizer in an output terminal of the second-order integrator 321 is shorter than a bit length indicating data less than the quantization step L of the quantizer in an output terminal of the second-order integrator 301. The precision of the data corresponding to the number of frequency division is determined in accordance with the number of bits of the output data from the second-order integrator 301 of the first stage. Thus, the precision does not change even if the number of bits of the output data from the following second-order integrator 321 is reduced. Therefore, the bits are truncated starting with the least significant bit (LSB), and this leads to the circuit scale being reduced although more quantization errors are caused due to truncation. Since the later stage is less affected by the reduction in the circuit scale, the circuit scale of the later stage can be reduced more remarkably.

Eighth Preferred Embodiment

Figure 16:
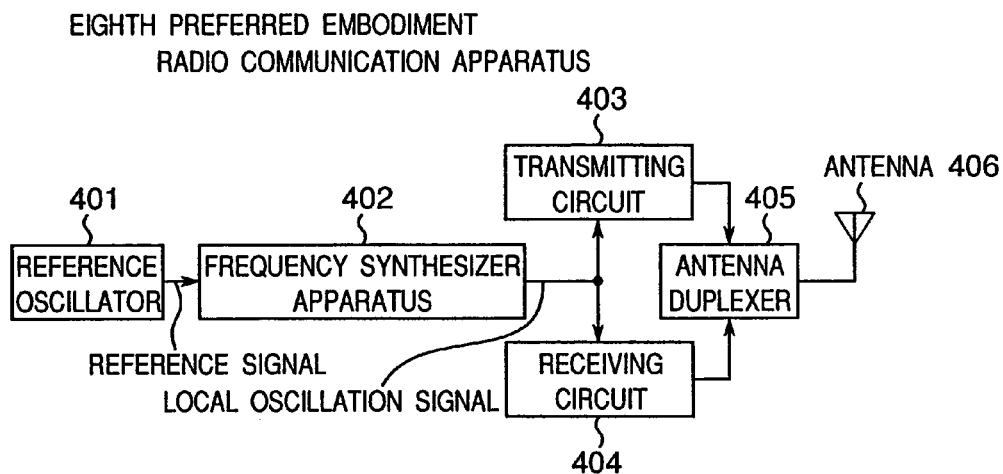
FIG. 16 is a block diagram showing a circuit configuration of a radio communication apparatus according to an eighth preferred embodiment of the present invention.

FIG. 16 is a block diagram showing a circuit configuration of a radio communication apparatus according to an eighth preferred embodiment of the present invention.

Referring to FIG. 16, the radio communication apparatus according to the preferred embodiment comprises a reference oscillator 401, a frequency synthesizer apparatus 402, a transmitting circuit 403, a receiving circuit 404, an antenna duplexer 405 and an antenna 406. The frequency synthesizer apparatus 402 is any one of the frequency synthesizer apparatuses according to the above-mentioned first to seventh preferred embodiments.

The reference oscillator 401 is a stable quartz oscillator and it generates a reference signal and supplies the generated reference signal to the frequency synthesizer apparatus 402. An output signal from the frequency synthesizer apparatus 402 is inputted to the transmitting circuit 403 and the receiving circuit 404 as a local oscillation signal. The transmitting circuit 403 subjects a radio signal to frequency conversion into higher frequency bands (up conversion) by using the local oscillation signal from the frequency synthesizer apparatus 402. The transmitting circuit 403 modulates the generated radio signal in accordance with an input data signal, and radiates the modulated radio signal toward a destination radio station of an opposite party through the antenna 406 via the antenna duplexer 405. On the other hand, a radio signal received from the destination radio station of the opposite party by the antenna 406 is inputted to the receiving circuit 404 through the antenna duplexer 405. The receiving circuit 404 subjects the input radio signal to frequency conversion into lower frequency bands (down conversion) by using the local oscillation signal from the frequency synthesizer apparatus 402. Furthermore, the receiving circuit 404 demodulates an intermediate frequency signal obtained through frequency conversion into a data signal, and then, outputs the data signal.

In the radio communication apparatus configured as described above, the transmitting circuit 403 transmits a radio signal or the receiving circuit 404 receives a further radio signal via a further frequency channel corresponding to a frequency of the above-mentioned local oscillation signal.

Since the frequency synthesizer apparatus 402 can set the output signal frequency with precision of 1/L of the frequency of the reference signal, the frequency synthesizer apparatus 402 can use the reference frequency higher than the interval of the frequency channel via which a signal is transmitted or received. Therefore, the frequency synthesizer apparatus 402 can increase a response speed of a phase-locked loop of a PLL circuit and thus reduce the time required to switch output frequencies. Moreover, the frequency synthesizer apparatus 402 can remarkably reduce spurious components caused by the frequency synthesizer apparatus 402.

In general, many mobile communication systems each using a digital modulation method have to monitor frequencies other than a frequency of a communication channel in order to observe the signal intensity of a plurality of base stations when a mobile station moves from one base station to another base station. Thus, the system needs to check other frequencies for a short unoccupied time between transmission and reception and also needs to switch frequencies at high speed. The frequency synthesizer apparatus according to the present invention is used as a local oscillation signal source, and this leads to a high-performance radio communication apparatus being realized.

In the above-mentioned eighth preferred embodiment, the description is given with regard to the radio or wireless communication apparatus. However, the present invention may be applied to a cable or wire communication apparatus for carrying out communications using a cable transmission method via a wire communication cable such as an optical fiber cable or a coaxial cable.

Ninth Preferred Embodiment

Figure 17:
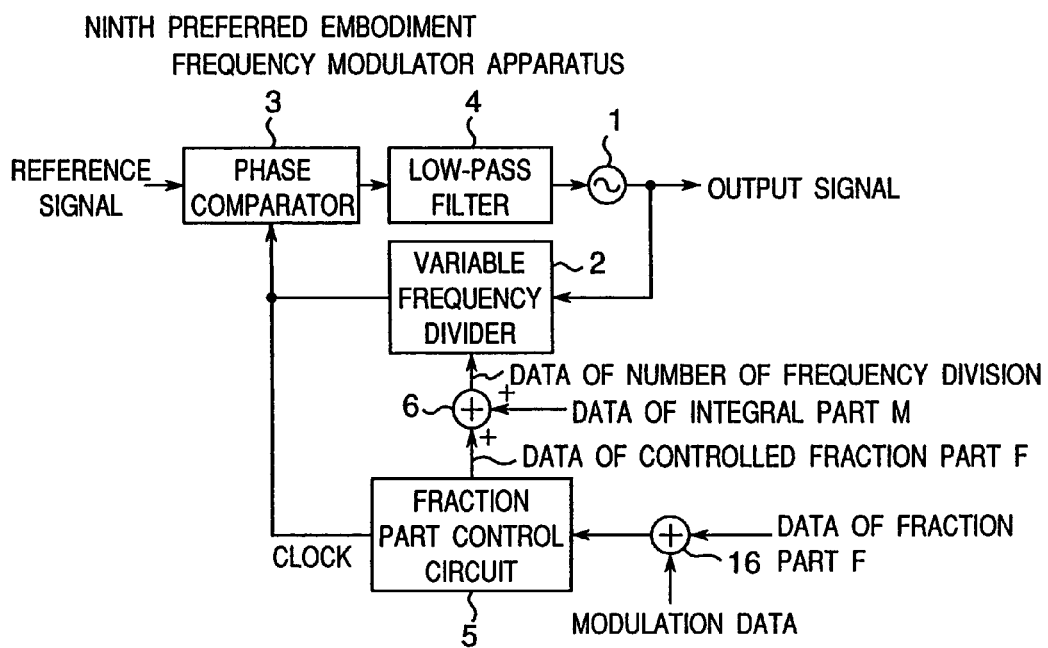
FIG. 17 is a block diagram showing a circuit configuration of a frequency modulator apparatus according to a ninth preferred embodiment of the present invention.

FIG. 17 is a block diagram showing a circuit configuration of a frequency modulator apparatus according to a ninth preferred embodiment of the present invention.

Referring to FIG. 17, the same components as the components shown in FIGS. 1 and 15 are indicated by the same reference numerals and symbols, and the detailed description thereof is omitted. As shown in FIG. 17, as compared with the frequency synthesizer apparatus shown in FIG. 1, the frequency modulator apparatus according to the ninth preferred embodiment is characterized in that input data to the fraction part control circuit 5 is composed of data which is obtained by an adder 16 where the added 16 adds data of a fraction part F to modulation data. As shown in FIG. 17, the resultant addition data of the fraction part F and the modulation data is input to the fraction part control circuit 5. The data of the fraction part F determines a center frequency of an output signal from the VCO 1, whereas the modulation data is used for frequency modulation to the output signal. The fraction part control circuit 5 may comprise any one of the fraction part control circuits 5 to 5f according to the first to seventh preferred embodiments.

In the frequency modulator apparatus configured as described above, the output signal from the VCO 1 is frequency-modulated in accordance with the modulation data inputted to the adder 16.

Generally speaking, when the frequency synthesizer apparatus is used to perform frequency modulation, an analog modulation signal must be applied to the reference signal or a control terminal of the VCO 1. However, a digital modulation method has recently become mainstream, and thus modulation data is generated by a digital circuit. Thus, when the frequency synthesizer apparatus is used to perform modulation as mentioned above, analog modulation data into which digital modulation data is converted by using a D/A converter must be applied to the reference signal or the control terminal of the VCO 1. However, there are the following problems. One problem is that signal transmission characteristics are prone to deteriorate due to the noise of the D/A converter. Another problem is that the circuit scale increases.

As shown in FIG. 17, according to a method in which, by using the frequency synthesizer apparatus according to the preferred embodiments of the present invention, modulation data is added to data of a fraction part F and then the resultant addition data is supplied to the fraction part control circuit 5, digital modulation data can be simply added to the data of the fraction part F in a form of digital data as it is. Thus, the D/A converter is unnecessary, which therefore simplifies the circuit configuration, and moreover, signal transmission characteristics are minimally deteriorated.

In the above-mentioned preferred embodiments, the description has been given with regard to the preferred embodiments and the modified preferred embodiments. However, the present invention is not limited to these individual detailed preferred embodiments. For example, a fourth-order or higher-order integrator may be used, although the second-order integrator or the third-order integrator is used in the above-described preferred embodiments.

As described in detail above, according to the preferred embodiments of the present invention, a frequency synthesizer apparatus including a PLL circuit comprises a fraction part control circuit for controlling input data of a fraction part and for outputting data of the controlled fraction part, and an adder means for adding input data of an integral part to the data of the controlled fraction part outputted from the fraction part control circuit-and for outputting resultant addition data to the variable frequency divider of the PLL circuit as data of a number of frequency division. The fraction part control circuit is a plural-n-th-order delta-sigma modulator circuit. Further, the fraction part control circuit periodically changes the input data of the fraction part with a clock period, thereby setting a frequency of an output signal from the voltage control oscillator in accordance with average data of the period.

Accordingly, according to the preferred embodiments of the present invention, a higher-order delta-sigma modulator circuit is used, and this leads to the present invention as having a unique advantageous effect of being both capable of setting the output frequency at frequency intervals shorter than the reference frequency, and capable of obtaining an output signal by remarkably reducing undesired spurious components.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims.

What is claimed is:

1. A frequency synthesizer apparatus comprising:
a voltage control oscillator operable to generate an output signal having a frequency corresponding to an input control voltage;
a variable frequency divider operable to divide the frequency of the output signal from said voltage control oscillator in accordance with an input data corresponding to a number of frequency division, and to output a frequency-divided signal;
a phase comparator operable to perform a phase comparison between the output signal from said variable frequency divider and an input reference signal, and to generate and output a signal indicating a result of the phase comparison;
a low-pass filter operable to low-pass-filter the output signal from said phase comparator, and to output the low-pass-filtered signal to said voltage control oscillator;
a fraction part control circuit operable to receive an input data of a fraction part, to control the input data of the fraction part so as to periodically change the input data of the fraction part according to a predetermined period corresponding to a value of the input data of the fraction part, and to output data of a controlled fraction part; and
a first adder operable to add an input data of an integral part to the data of the controlled fraction part outputted from said fraction part control circuit, and to output resultant addition data to said variable frequency divider as the input data corresponding to the number of frequency division, wherein said fraction part control circuit is a plural-(n+m)-th-order delta-sigma modulator circuit, said fraction part control circuit comprising:
  a first delta-sigma modulator circuit;
  a second delta-sigma modulator circuit; and
  a natural-number-n-th-order differential circuit having a transfer function which is expressed by $(1-z^{-1})^n$ using a z-transformation for representing delay of one clock period as $z^{-1}$,
wherein said first delta-sigma modulator circuit comprises:
  a first integrator which is a natural-number-n-th-order integrator;
  a first quantizer; and
  a first feedback circuit,
wherein said second delta-sigma modulator circuit comprises:
  a second integrator which is a natural-number-m-th-order integrator;
  a second quantizer; and
  a second feedback circuit,
wherein output data from said second quantizer of said second delta-sigma modulator circuit is inputted to said natural-number-n-th-order differential circuit,
wherein said fraction part control circuit further comprises:
  a second multiplier operable to multiply output data from said first quantizer by the predetermined quantization step, and to output resultant multiplication data;
  a subtracter operable to subtract the output data from said second multiplier from output data from said first integrator, and to output resultant subtraction data to said second delta-sigma modulator circuit;
  a delay operable to delay the output data from said first quantizer in said first delta-sigma modulator circuit so as to be synchronized with a timing of output data from said natural-number-n-th-order differential circuit; and
  a second adder operable to add the output data delayed by said delay to the output data from said natural-number-n-th-order differential circuit, and to output resultant addition data as output data from said fraction part control circuit.

* * * * *